US012733440B2

(12) United States Patent
Chen et al.

(10) Patent No.: US 12,733,440 B2
(45) Date of Patent: Sep. 8, 2026

(54) SYSTEM AND METHOD FOR AUTOMATED WAFER CARRIER HANDLING

(71) Applicant: Taiwan Semiconductor Manufacturing Company, Ltd., Hsinchu (TW)

(72) Inventors: Yung-Ho Chen, Hsinchu City (TW); Chung-Hsung Yang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 764 days.

(21) Appl. No.: 18/071,639

(22) Filed: Nov. 30, 2022

(65) Prior Publication Data

US 2023/0089597 A1 Mar. 23, 2023

Related U.S. Application Data

(63) Continuation of application No. 16/667,815, filed on Oct. 29, 2019, now Pat. No. 11,551,959.

(51) Int. Cl.
*H10P 72/30* (2026.01)
*B25J 5/00* (2006.01)
(Continued)

(52) U.S. Cl.
CPC ............ *H10P 72/3404* (2026.01); *B25J 5/00* (2013.01); *B25J 9/023* (2013.01); *B65G 1/137* (2013.01);
(Continued)

(58) Field of Classification Search
CPC ......... H01L 21/67769; H01L 21/67706; H01L 21/67724; H01L 21/6773; H01L 21/67733;
(Continued)

(56) References Cited

U.S. PATENT DOCUMENTS

2002/0105236 A1* 8/2002 Fosnight ........... H01L 21/67242 307/326
2003/0235486 A1* 12/2003 Doherty ............... B65G 1/0457 414/217.1

(Continued)

FOREIGN PATENT DOCUMENTS

| | | |
|---|---|---|
| CN | 101412463 | 4/2009 |
| CN | 109786280 | 5/2019 |
| JP | 2006245312 A * | 9/2006 |

OTHER PUBLICATIONS

"Office Action of China Counterpart Application", issued on Jul. 18, 2024, p. 1-p. 9.

*Primary Examiner* — Ernesto A Suarez
*Assistant Examiner* — Laurence R Brothers
(74) *Attorney, Agent, or Firm* — JCIPRNET

(57) ABSTRACT

A system and an operating method for automated wafer carrier handling are provided. The system includes a storage rack including a standby position and a storage position separated from each other, a first and second moving mechanism, and a controller operatively coupled to the first and second moving mechanism to control operations of the first and second moving mechanism. The storage position is for buffering a wafer carrier awaiting transfer to a load port. The first moving mechanism is movably coupled to the storage rack and provides at least one degree of freedom of movement to transfer the wafer carrier from the storage position to the standby position. The second moving mechanism is disposed over the storage rack, operatively coupled the storage rack to the load port, and provides at least one degree of freedom of movement to transfer the wafer carrier from the standby position to the load port.

20 Claims, 34 Drawing Sheets

(51) Int. Cl.
*B25J 9/02* (2006.01)
*B65G 1/137* (2006.01)

(52) U.S. Cl.
CPC ...... *H10P 72/3202* (2026.01); *H10P 72/3214* (2026.01); *H10P 72/3218* (2026.01); *H10P 72/3221* (2026.01); *H10P 72/3222* (2026.01); *H10P 72/34* (2026.01)

(58) Field of Classification Search
CPC ........ H01L 21/67736; H01L 21/67763; B65G 1/137; H10P 72/3404; H10P 72/3202; H10P 72/3214; H10P 72/3218; H10P 72/3221; H10P 72/3222; H10P 72/34; B25J 5/00; B25J 9/023
See application file for complete search history.

(56) References Cited

U.S. PATENT DOCUMENTS

2009/0104006 A1* 4/2009 Murata ............. H01L 21/67733 414/225.01
2013/0058743 A1* 3/2013 Rebstock ............ H10P 72/3404 414/281
2019/0006217 A1* 1/2019 Motoori ................... B65G 1/00

* cited by examiner

160 {162, 164, 166}

160: 162, 163, 164, 166, 167

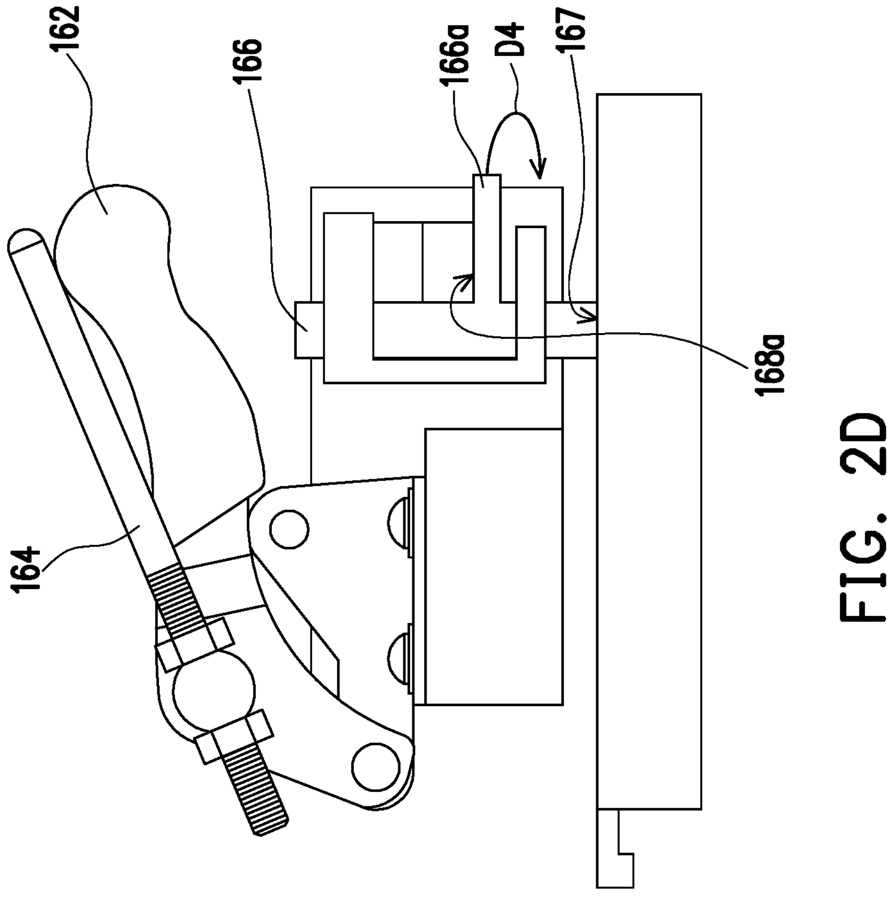
FIG. 2D
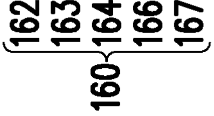

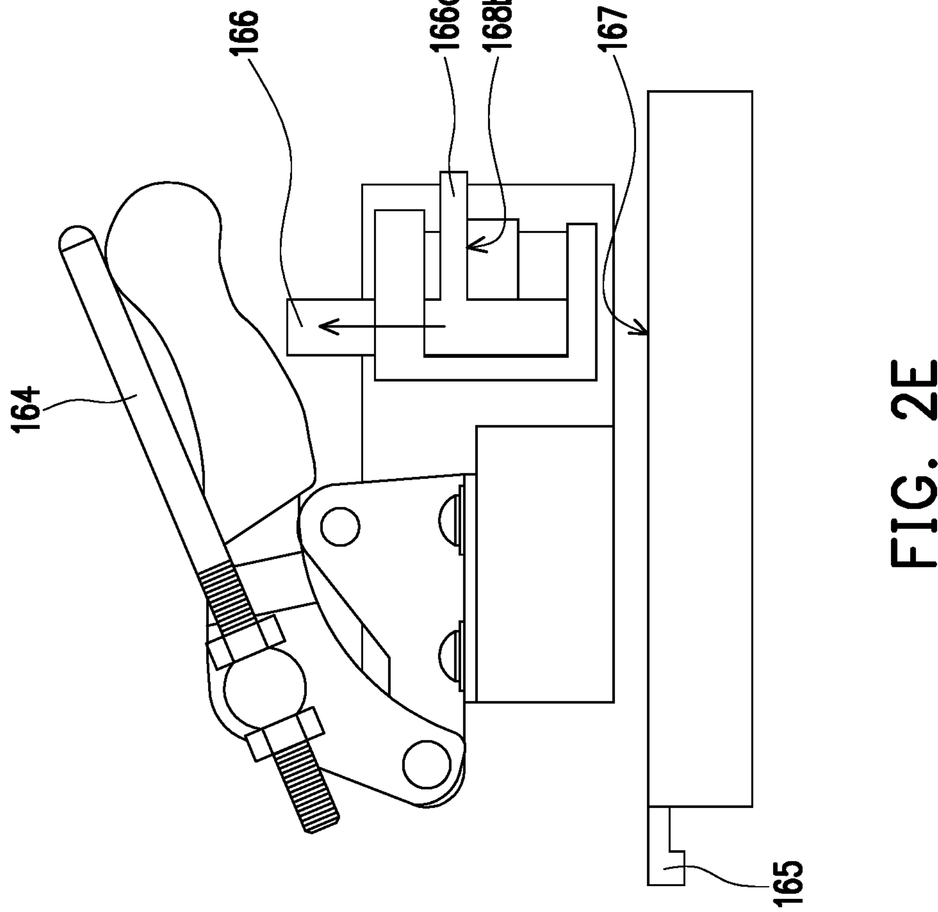
FIG. 2E
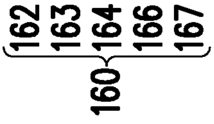

SYSTEM AND METHOD FOR AUTOMATED WAFER CARRIER HANDLING

CROSS-REFERENCE TO RELATED APPLICATION

This application is a continuation application of and claims the priority benefit of a prior application Ser. No. 16/667,815, filed on Oct. 29, 2019. The entirety of the above-mentioned patent application is hereby incorporated by reference herein and made a part of this specification.

BACKGROUND

A typical semiconductor fabrication facility includes a plurality of processing zones including semiconductor processing tools and wafer staging equipment. Each processing zone may include a stocker which temporarily holds multiple wafer carriers or in preparation for transporting wafer carriers to the load port of a semiconductor processing tool. A number of semiconductor wafers are commonly stored in the wafer carrier (e.g., a pod) which is used to move the semiconductor wafers throughout the fabrication facility to different semiconductor processing tools. Conventionally, the wafer carriers are transported to semiconductor processing tools and/or loaded onto load ports by human operators. In modern fabrication facilities, a great emphasis is placed on limiting the presence of human operators in the processing zone and improving the efficiency of semiconductor fabrication. Accordingly, a need exists for fabrication facility that can automatically load/unload pods to and from a load port to minimize labor requirements and improve the efficiency of fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2E are schematic enlarged views illustrating a quick release mechanism at various stages of releasing process according to some embodiments of the present disclosure.

DETAILED DESCRIPTION

Figure 1A:
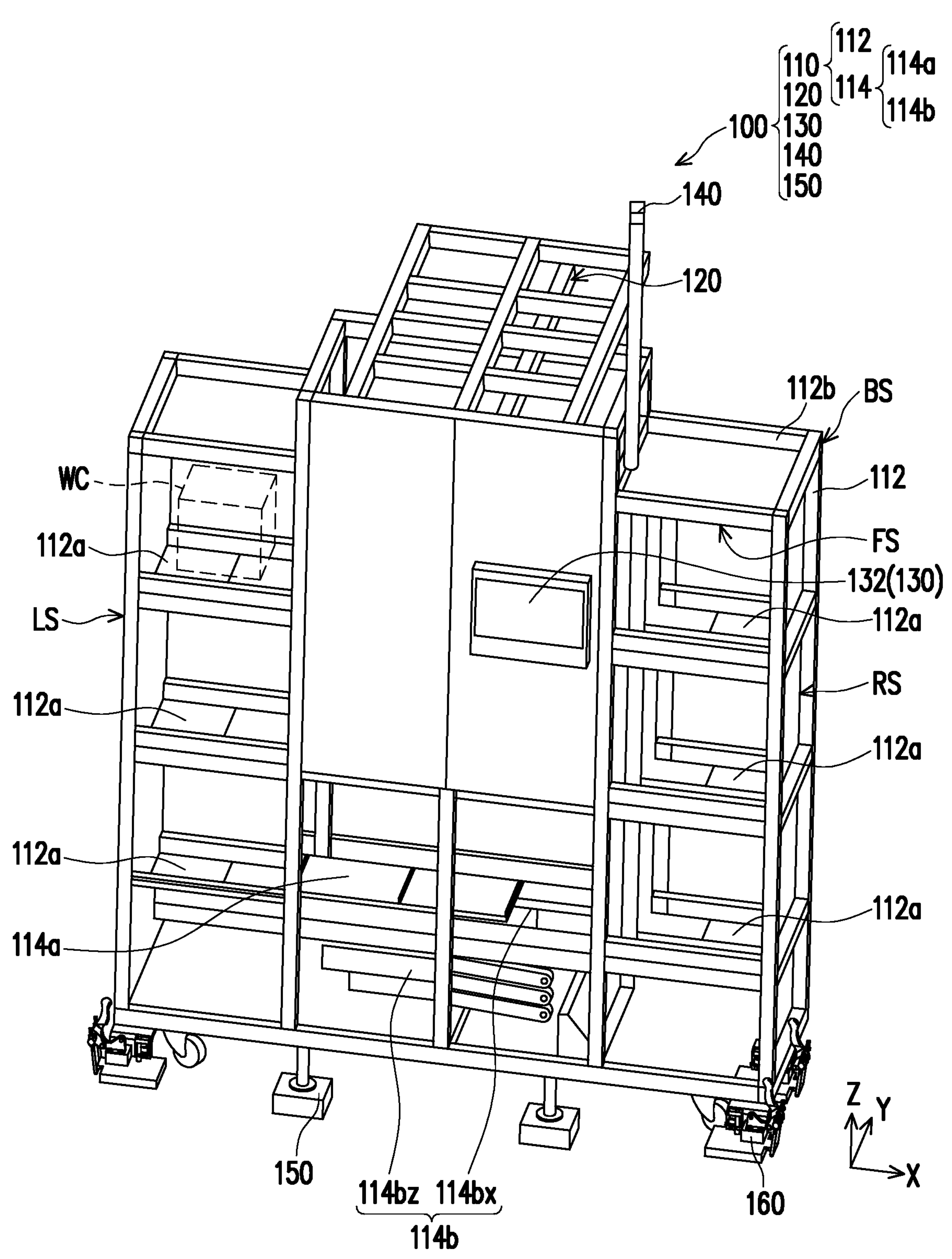
FIG. 1A is a schematic perspective view illustrating an automated wafer carrier handling system according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor fabrication facilities (e.g., FABs) may typically utilize manual movement of semiconductor wafers in wafer carriers (e.g., pods, containers, etc.) around a FAB between different areas of wafer processing or storage. However, typical manual movement may be resource intensive and prone to inefficiency, due to requiring manual human movement and control. The present disclosure provides various embodiments of system and operation method for automated wafer handling which include different classes of mechanisms that may autonomously coordinate amongst themselves for movement of wafer carriers transferring to load ports, thereby achieving minimization of labor requirement and improvement of the efficiency of fabrication.

Figure 1B:
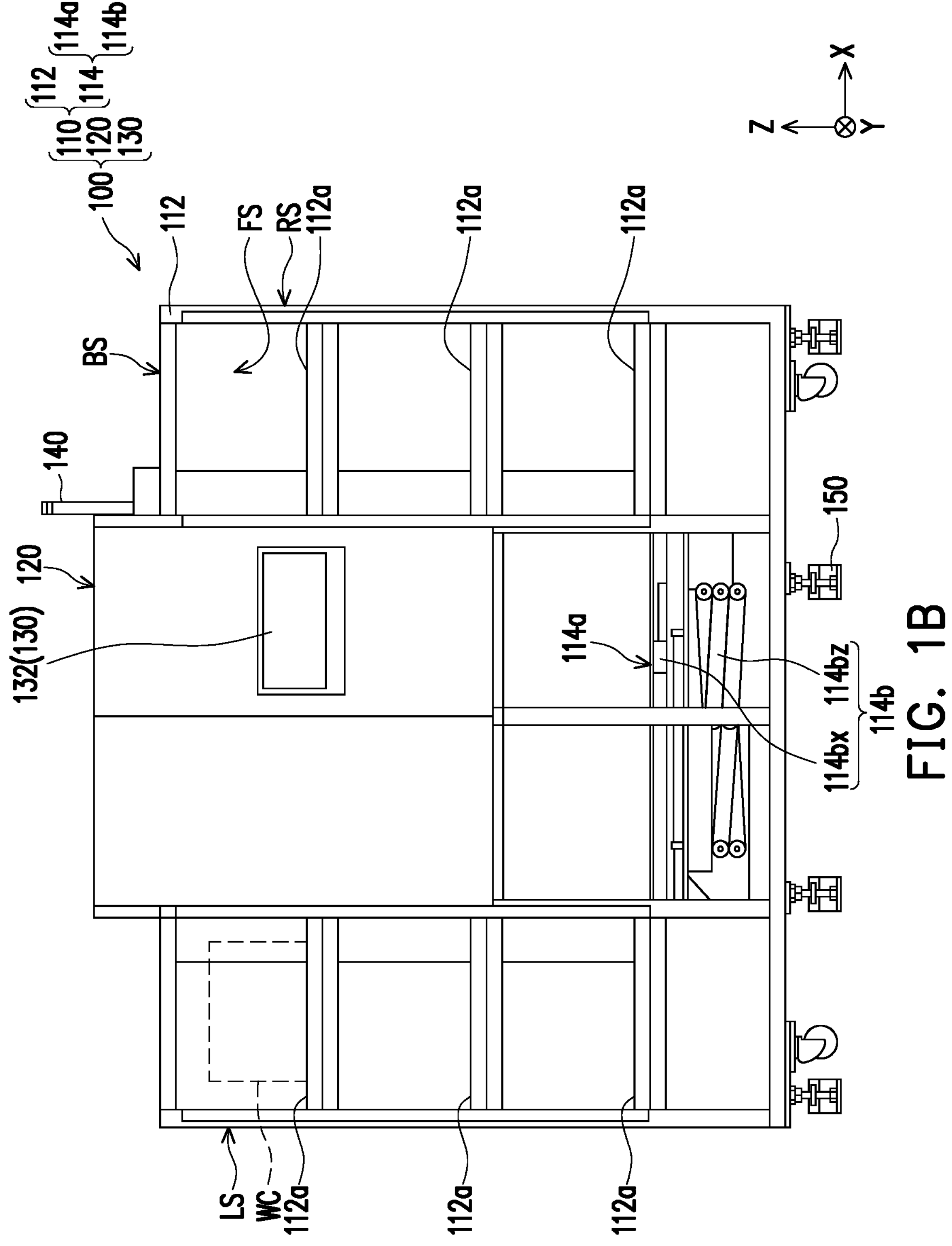
FIG. 1B is a schematic front view illustrating an automated wafer carrier handling system according to some embodiments of the present disclosure.
Figure 1C:
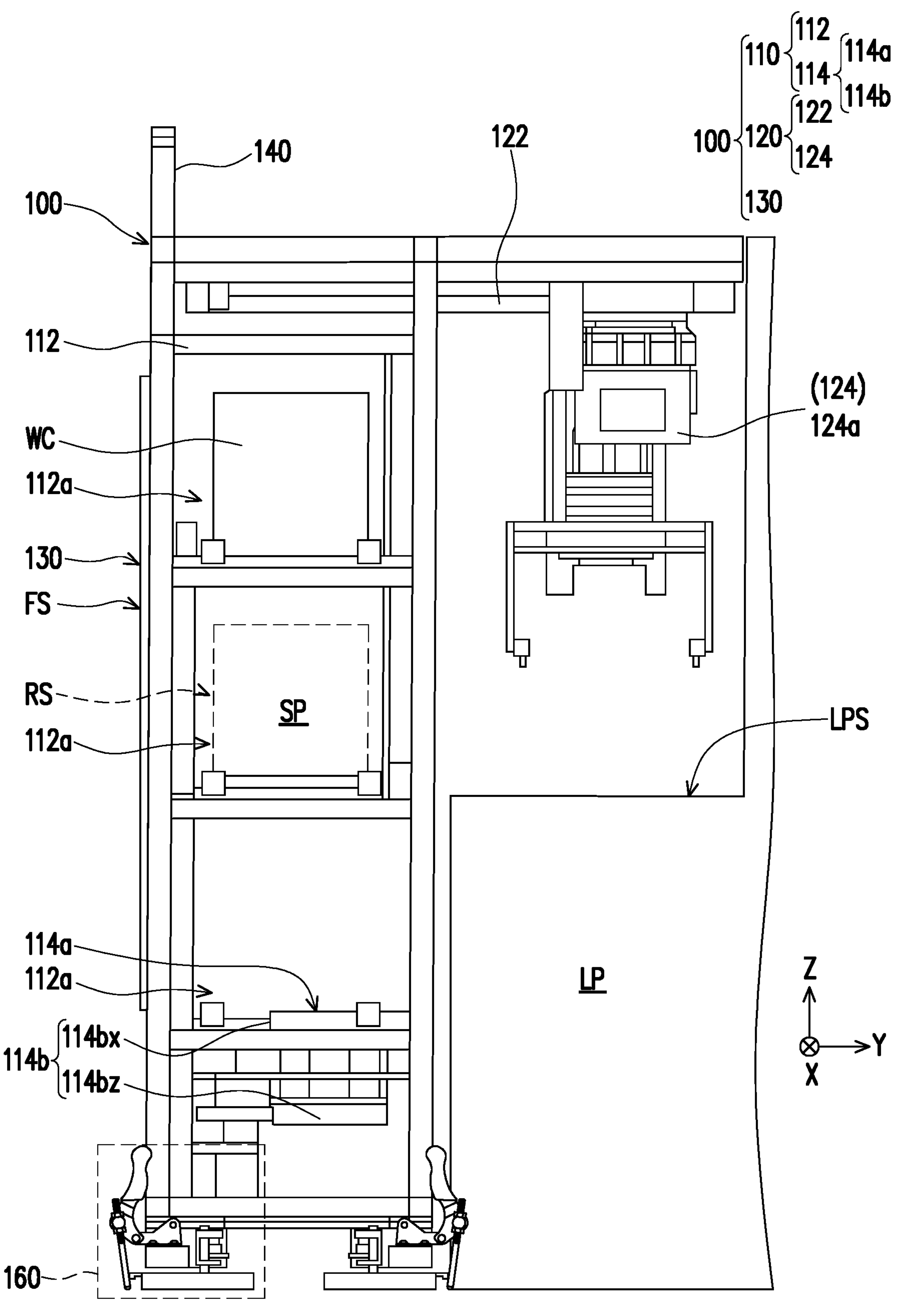
FIG. 1C is a schematic right side view illustrating an automated wafer carrier handling system according to some embodiments of the present disclosure.

FIG. 1A is a schematic perspective view illustrating an automated wafer carrier handling system according to some embodiments of the present disclosure, FIG. 1B is a schematic front view illustrating an automated wafer carrier handling system according to some embodiments of the present disclosure, FIG. 1C is a schematic right side view illustrating an automated wafer carrier handling system according to some embodiments of the present disclosure, and FIG. 1C is a schematic enlarged view of the dashed area outlined in FIG. 1C according to some embodiments.

Referring to FIG. 1A to FIG. 1D, an automated wafer carrier handling system 100 includes a storage apparatus 110 and a transfer apparatus 120. For example, the automated wafer carrier handling system 100 is disposed near a semiconductor processing tool for buffering a plurality of wafer carriers WC to be loaded to a load port LP (shown in FIG. 1C) of the semiconductor processing tool. The load port LP may be affixed to a front end of the semiconductor processing tool or semiconductor manufacturing equipment (not shown). The load port LP may be configured to receive the wafer carrier WC, and the wafer carrier WC may be loaded on the load port LP for further processing. The wafer carrier WC may be a pod which carries a cassette holding one or more semiconductor wafers for processing. The wafer carrier WC housing the semiconductor wafers may be transported from stations to stations in the semiconductor fabrication facility. In some embodiments, the storage apparatus 110 includes a storage rack 112. For example, the storage rack 112 is a multi-tiered structure within which is defined a plurality of compartments 112*a*. The compartments 112*a* may be viewed as the storage positions. Each of the wafer carriers WC may be stored or accommodated within one of the compartments 112*a*. It should be noted that although six of the compartments 112*a* are illustrated, the number and the arrangement of compartments 112*a* may be adjusted depending on the requirements and construe no limitation in the disclosure.

The storage rack 112 may serve as a buffering zone for temporarily storing the wafer carriers WC which are awaiting transfer to the load port LP. The storage rack 112 may include various guide members, sensors, and tag readers which are disposed on the compartments 112*a* to ensure that the wafer carriers WC are stored in place. For example, the guide members are installed on each of the compartments 112*a* to facilitate the positioning of the wafer carrier WC when placing. The sensors (e.g., present sensors, tilt sensors, detecting sensors, etc.) may be installed on each of the compartments 112*a* to detect if the wafer carrier WC is in a tilting position. The tag reader may be disposed on each of the compartments 112*a* and configured to receive wafer data that is stored on the wafer carriers (e.g., as an RFID tag or the like).

In some embodiments, the storage apparatus 110 includes a moving mechanism 114 which is configured to move the wafer carriers WC that are stored in the compartments 112*a* to a standby position SP for further transferring to the load port LP. For example, the moving mechanism 114 is equipped with a carrying member 114*a* for carrying the wafer carrier WC. The moving mechanism 114 may include a driving unit 114*b* configured to drive the carrying member 114*a* and providing at least one degree of freedom of movement. The carrying member 114*a* may be or may include a stage, a platform, a fork, a gripper, or the like. The carrying member 114*a* may take various forms as long as the wafer carrier WC is stably carried thereon during transferring. In some embodiments, the carrying member 114*a* includes an engaging component (not shown) disposed on a receiving surface of the carrying member 114*a* for guiding and/or engaging the wafer carrier WC in place on the carrying member 114*a*. In some embodiments, each of the compartments 112*a* is equipped with slide rails, and the carrying member 114*a* driven by the driving unit 114*b* may move into and out of the compartments 112*a* via the slide rails. Alternatively, the slide rails in the compartments 112*a* are omitted.

For example, by means of the driving unit 114*b*, the carrying member 114*a* carrying the wafer carrier WC is made to perform reciprocating movements. In some embodiments, the driving unit 114*b* includes a z-axis mover 114*bz* assembled to the bottom of the storage rack 112. The carrying member 114*a* may be furnished on the z-axis mover 114*bz* so as to move vertically via the z-axis mover 114*bz*. For example, by means of the z-axis mover 114*bz*, the carrying member 114*a* carrying the wafer carrier WC is made to perform up-and-down linear motion in Z-axis direction. In some embodiments, the z-axis mover 114*bz* includes a scissor lift with multiple crossed arm pairs joined pivotally to one another at crossing point. The z-axis mover 114*bz* may be equipped with any suitable driving component (e.g., hydraulic cylinder, or the like) to drive the scissor lift. The z-axis mover 114*bz* may include motor gears, shafts, bearing, guide rails, and/or any suitable driving component for driving the carrying member 114*a*. It should be noted that the z-axis mover 114*bz* may be any type of lift device (e.g., belt drive, chain drive, screw drive, gear drive, etc.) for elevating and lowering the carrying member 114*a*.

In some embodiments, the driving unit 114*b* includes an x-axis mover 114*bx* furnished on the carrying member 114*a* and capable of driving the carrying member 114*a* to perform back-and-forth linear motion in X-axis direction. For example, the x-axis mover 114*bx* includes a linear guideway including a slide block operably mounted on a rail for guiding the carrying member 114*a*. The x-axis mover 114*bx* may include other components, such as motor gears, shafts, bearing, and/or any suitable driving components, assembled to the linear guideway. It should be noted that the x-axis mover 114*bx* may be implemented as any suitable mechanism for translating the carrying member 114*a*. Other configuration of the driving unit 114*b* is possible as long as the wafer carriers WC at the storage positions (i.e. compartments 112*a*) may be transferred to the standby position SP. The x-axis mover 114*bx* and the z-axis mover 114*bz* assembled to the storage rack 112 may provide two degrees of freedom of movement, such as vertically between the top and the bottom of the storage rack 112 and horizontally to either side of the storage rack 112.

In some embodiments, the transfer apparatus 120 includes a moving mechanism including a track 122 and a robotic arm 124 for providing at least one degree of freedom of movement above the storage rack 112. The track 122 may be an overhead track unit connected to the top of the storage rack 112, and the robotic arm 124 may be moveably connected to the track 122. For example, the robotic arm 124 may slide through the track 122 to transfer the wafer carrier WC between the storage apparatus 110 and the load port LP (shown in FIG. 1C). In some embodiments, the robotic arm 124 may include a gripper or other suitable manner of manipulating the wafer carrier WC between the carrying member 114*a* positioned at the standby position SP and the receiving surface of the load port LP. In some embodiments, the robotic arm 124 is configured to pick up, move, and put back down the wafer carrier WC. For example, the robotic arm 124 is equipped with a y-axis mover 124*a* configured to provide a degree of freedom of movement. The robotic arm 124 may be driven by the y-axis mover 124*a* to move backward and forward in Y-axis direction along the track 122. The robotic arm 124 is optionally equipped with the z-axis mover to move upwardly and downwardly along the Z-axis direction. In other embodiments, the robotic arm 124 is equipped with multiple movers (e.g., a y-axis mover, an x-axis mover, a z-axis mover, or a combination of these) configured to provide multi-degree of freedom of movement.

In some embodiments, the automated wafer carrier handling system 100 includes a user interface panel 130 mounted on the storage rack 112 of the storage apparatus 110 and facing the operator of the automated wafer carrier handling system 100. For example, the user interface panel 130 and the load port LP are disposed at two opposing sides of the storage rack 112. In some embodiments, the user interface panel 130 is installed between two vertical columns of the compartments 112*a*. The user interface panel 130 may include any type of interface for input and/or output to the operator. For example, the user interface panel 130 houses various motors and controls for operating the automated wafer carrier handling system 100. For example, the handling and/or transport operations are conducted under automatic control using a controller 132 of the user interface panel 130 which issues control signals for operating the storage apparatus 110 and the transfer apparatus 120 without intervention by the operator. The controller 132 may include, but not limited to, a monitor, a computing device, or a mobile device, etc., for controlling the movement of the storage apparatus 110 and the transfer apparatus 120 by program instructions, codes, or the like. In some embodiments, the controller 132 interfaces with the moving mechanism(s) of the storage apparatus 110 and/or the transfer apparatus 120 using hardwire or wireless technologies. The controller 132 may be also designed to communicate with controller(s) coupled to the processing tool. In some embodiments, the user interface panel 130 includes hardware and software that allows the automated wafer carrier handling system 100 to communicate with other processing systems over a network. The user interface panel 130 may allow the operator to manipulate the automated wafer carrier handling system 100 manually and/or remotely.

In some embodiments, the automated wafer carrier handling system 100 includes a signal pole 140 mounted on the front top of the storage rack 112. The signal pole 140 may be programmed to signal the operator of certain conditions. In some embodiments, the signal pole 140 acts as the obstacle above the load port LP. For example, the back side BS of the storage rack 112 is shielded by a cover plate 112*b*, while other side(s) of the storage rack 112, such as the front side FS, the right side RS, and the left side LS, may not be covered by any shielding plate (reference to the "front", "back", "right", and "left" sides is from the perspective view of the storage rack 112 as depicted in FIG. 1A). For example, the backside of each compartment 112*a* is covered by the cover plate 112*b* while other sides are not covered. In such embodiments, the storage apparatus 110 may include light curtains (not shown) or other detection device arranged on at least the front side FS of the storage rack 112 to guard the compartments 112*a* by detecting inadvertent entry into the compartments 112*a*. The details thereof will be described later in accompany with figures.

Figure 1D:
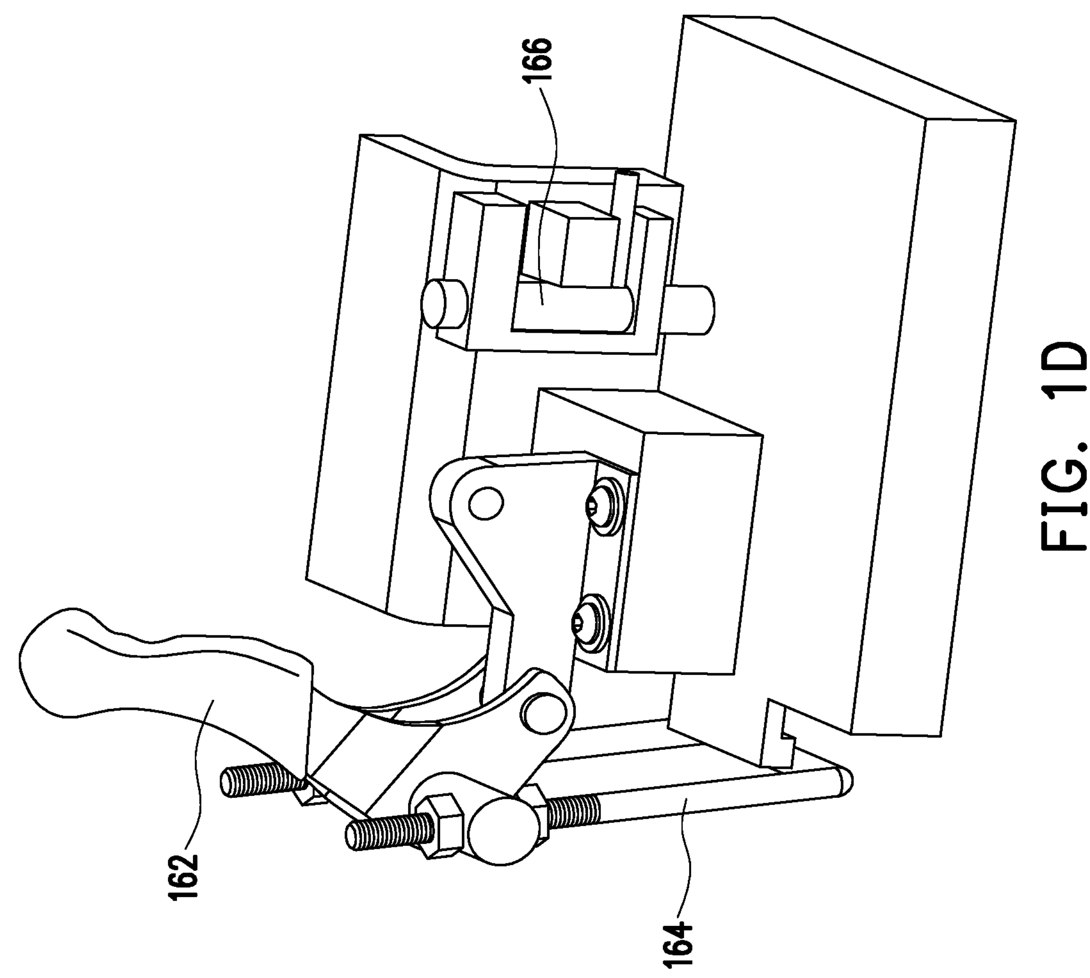
FIG. 1D is a schematic enlarged view of the dashed area outlined in FIG. 1C according to some embodiments.

Continue to FIG. 1C and FIG. 1D, in some embodiments, the storage apparatus 110 is equipped with a quick positioning mechanism 150 for quickly and easily positioning the storage rack 112 in place when installing. For example, the quick positioning mechanism 150 of the storage apparatus 110 includes multiple supporting feet disposed on the bottom of the storage rack 112, and positioning components disposed on the support feet. The positioning components may be used to quickly position the storage rack 112 when installing and reposition the storage rack 112 when the storage rack 112 is shifted or moved, and then moved back in place. By means of the quick positioning mechanism 150, the storage rack 112 may be repositioned without act of recalibration of the moving mechanism 114 so as to achieve quick installation. In some embodiments, the storage apparatus 110 is equipped with a quick release mechanism 160 for quickly and easily remove the storage rack 112 from the automated wafer carrier handling system 100. For example, the quick release mechanism 160 is disposed on the bottom of the storage apparatus 110 and includes a handle 162, a buckle 164 connected to the handle, and a positioning pin 166 disposed aside the handle 162 and the buckle 164. The operation method of the quick release mechanism 160 will be described below.

Figure 2A:
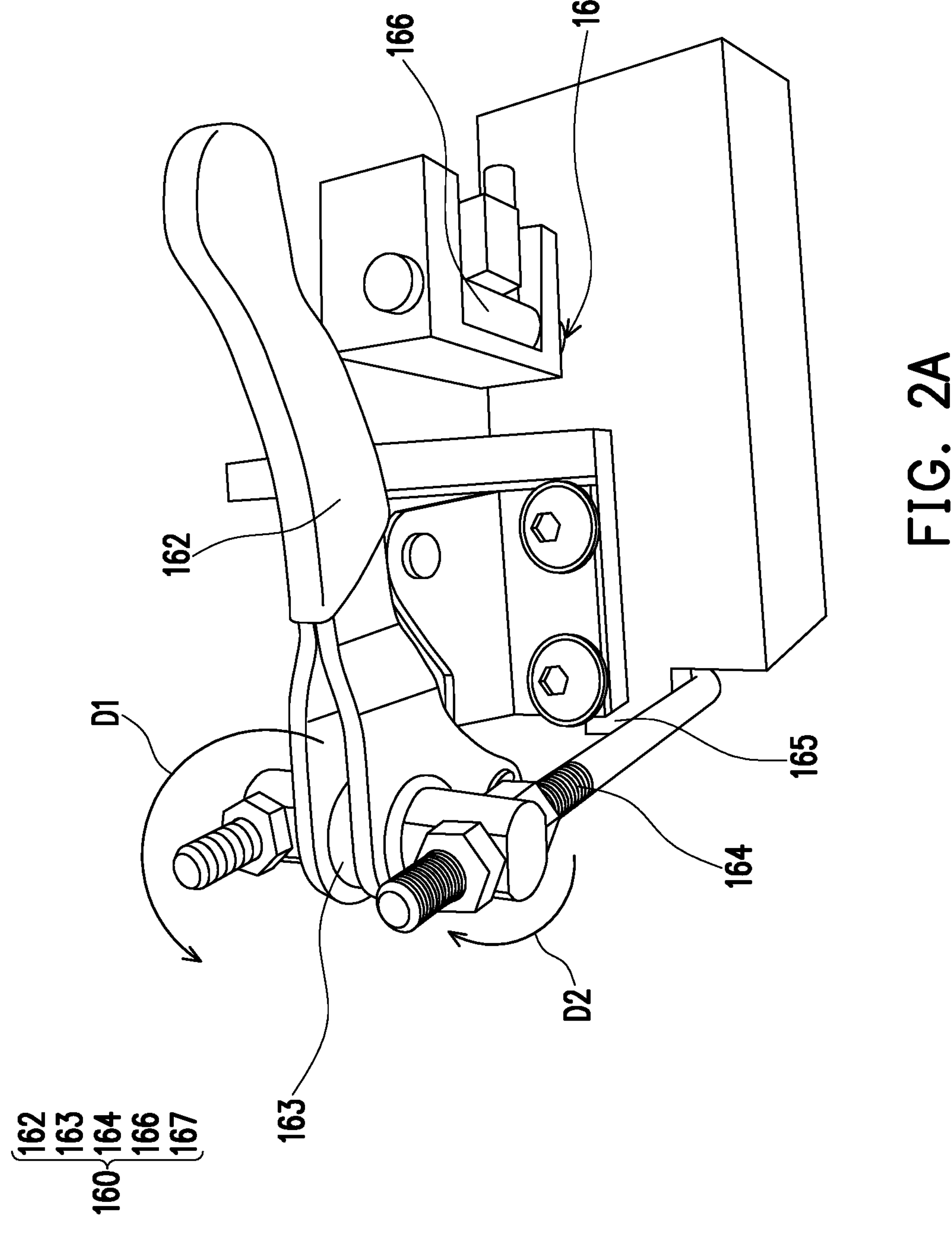

FIG. 2A to FIG. 2E are schematic enlarged views illustrating a quick release mechanism at various stages of releasing process according to some embodiments of the present disclosure. The operation method of releasing the storage apparatus from the predetermined position at least includes the following steps. Referring to FIG. 2A, when the storage apparatus is locked at the predetermined position, the buckle 164 of the quick release mechanism 160 is engaged with a lateral latch 165 and the positioning pin 166 is inserted in a position hole 167.

Figure 2B:
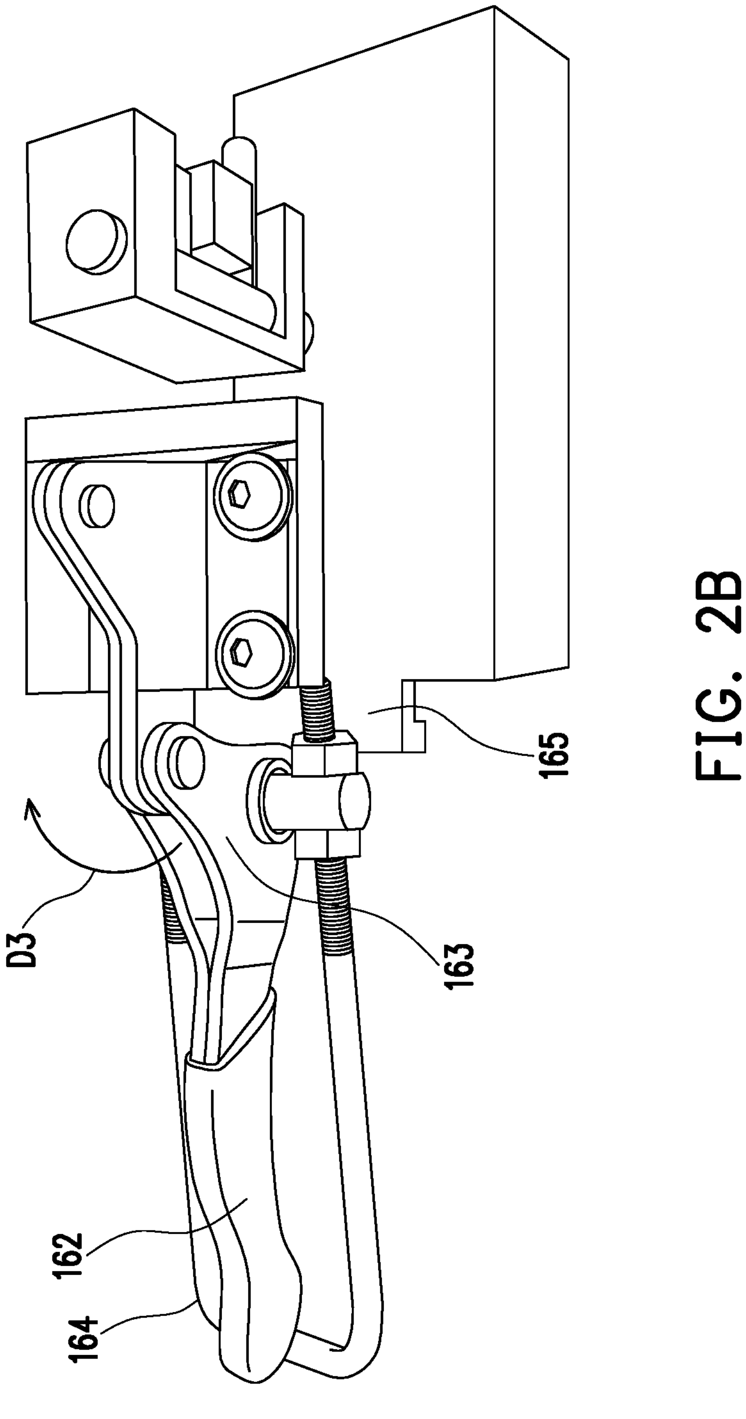

Continue to FIG. 2A and also referring to FIG. 2B, when performing a releasing process on the storage apparatus, the handle 162 of the quick release mechanism 160 is moved along the rotational axis direction as indicated by the arrow D1. For example, the handle 162 is rotated at least 90 degrees in a counterclockwise direction in a side view of the quick release mechanism 160. In some embodiments, the handle 162 is rotated from the right side to the left side (or from the left side to the right side in other embodiments) relative to the linkage 163 of the handle 162 and the buckle 164. When moving the handle 162, the buckle 164 that is connected to the handle 162 is released from the lateral latch 165 and also moved along the rotational axis direction as indicated by the arrow D2. For example, the buckle 164 is rotated from the bottom side to the left side relative to the linkage 163 of the handle 162 and the buckle 164. As shown in FIG. 2B, after the handle 162 and the buckle 164 are moved, the handle 162 and the buckle 164 are located at the same side (e.g., left side) of the linkage 163. For example, the handle 162 is located above the buckle 164.

Figure 2C:
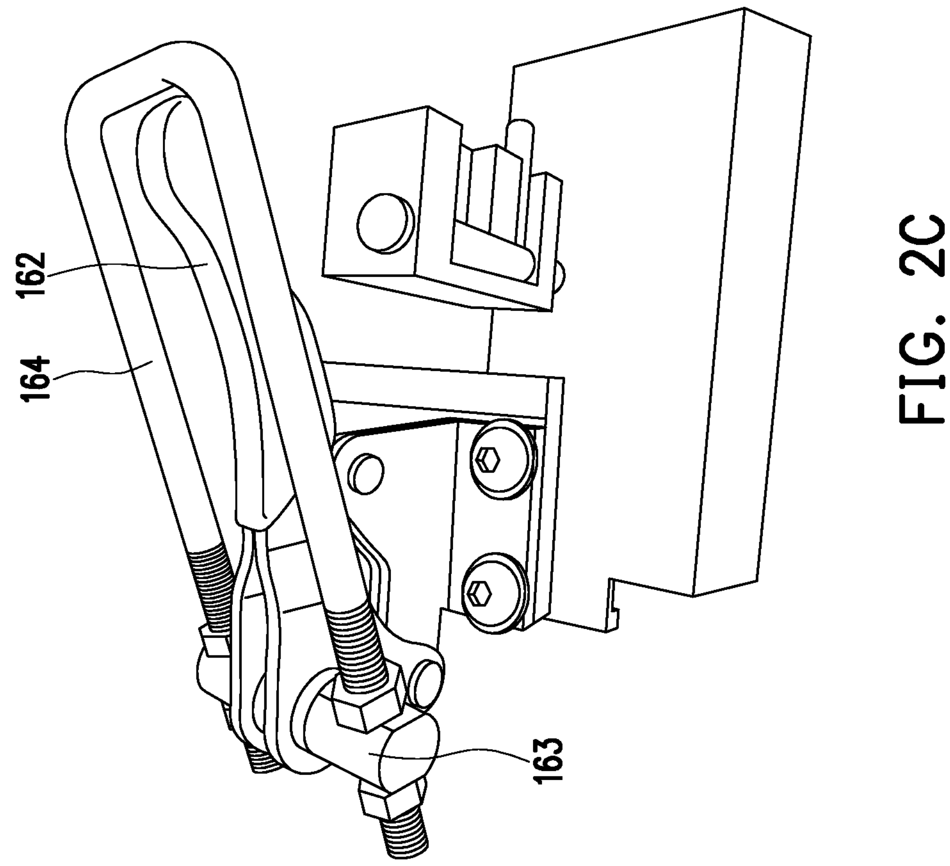

Continue to FIG. 2B and also referring to FIG. 2C, moving the handle 162 and the buckle 164 toward the locked position along as indicated by the arrow D3. For example, the handle 162 and the buckle 164 are rotated in a clockwise direction to the right side of the linkage 163 in the side view of the quick release mechanism 160.

Referring to FIG. 2D, moving a lateral protrusion 166*a* of the positioning pin 166 along the rotational axis direction as indicated by the arrow D4. For example, the lateral protrusion 166*a* of the positioning pin 166 is rotated in a clockwise direction in a top view of the quick release mechanism 160. In some embodiments, the lateral protrusion 166*a* of the positioning pin 166 is engaged with a bottom latch 168*a* when the storage apparatus is locked at the predetermined position. Moving the lateral protrusion 166*a* of the positioning pin 166 is to release the lateral protrusion 166*a* from the bottom latch 168*a*.

Continue to FIG. 2D and also referring to FIG. 2E, after releasing the lateral protrusion 166*a* of the positioning pin 166 from the bottom latch 168*a*, the lateral protrusion 166*a* of the positioning pin 166 is moved upwardly as indicated by the arrow D5. For example, when moving the lateral protrusion 166*a* upwardly, the portion of the positioning pin 166 that is inserted in the positioning hole 167 is also moved out of the positioning hole 167. The lateral protrusion 166*a* of the positioning pin 166 may be rotated in a counterclockwise direction in the top view so that the lateral protrusion 166*a* is engaged with a top latch 168*b*. When the buckle 164 is released from the lateral latch 165 and the positioning pin 166 is moved out of the positioning hole 167, the storage apparatus is ready to move away from the predetermined position. A reverse sequence of operations may be performed to lock the storage apparatus at the predetermined position via the quick release mechanism 160.

Figure 3A:
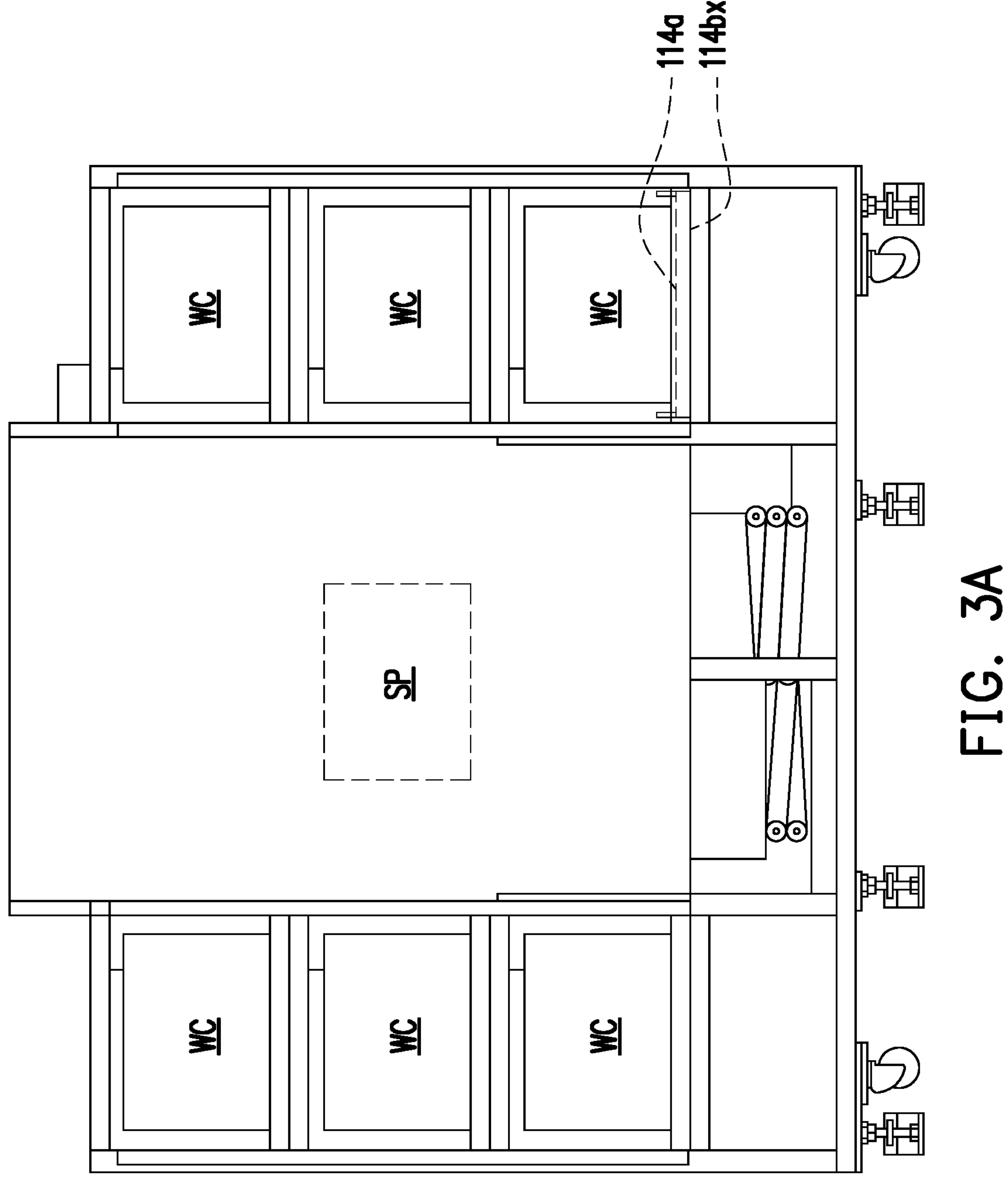
FIG. 3A to FIG. 3C are schematic front views illustrating a storage apparatus at various stages of performing an operation method according to some embodiments of the present disclosure.
Figure 3B:
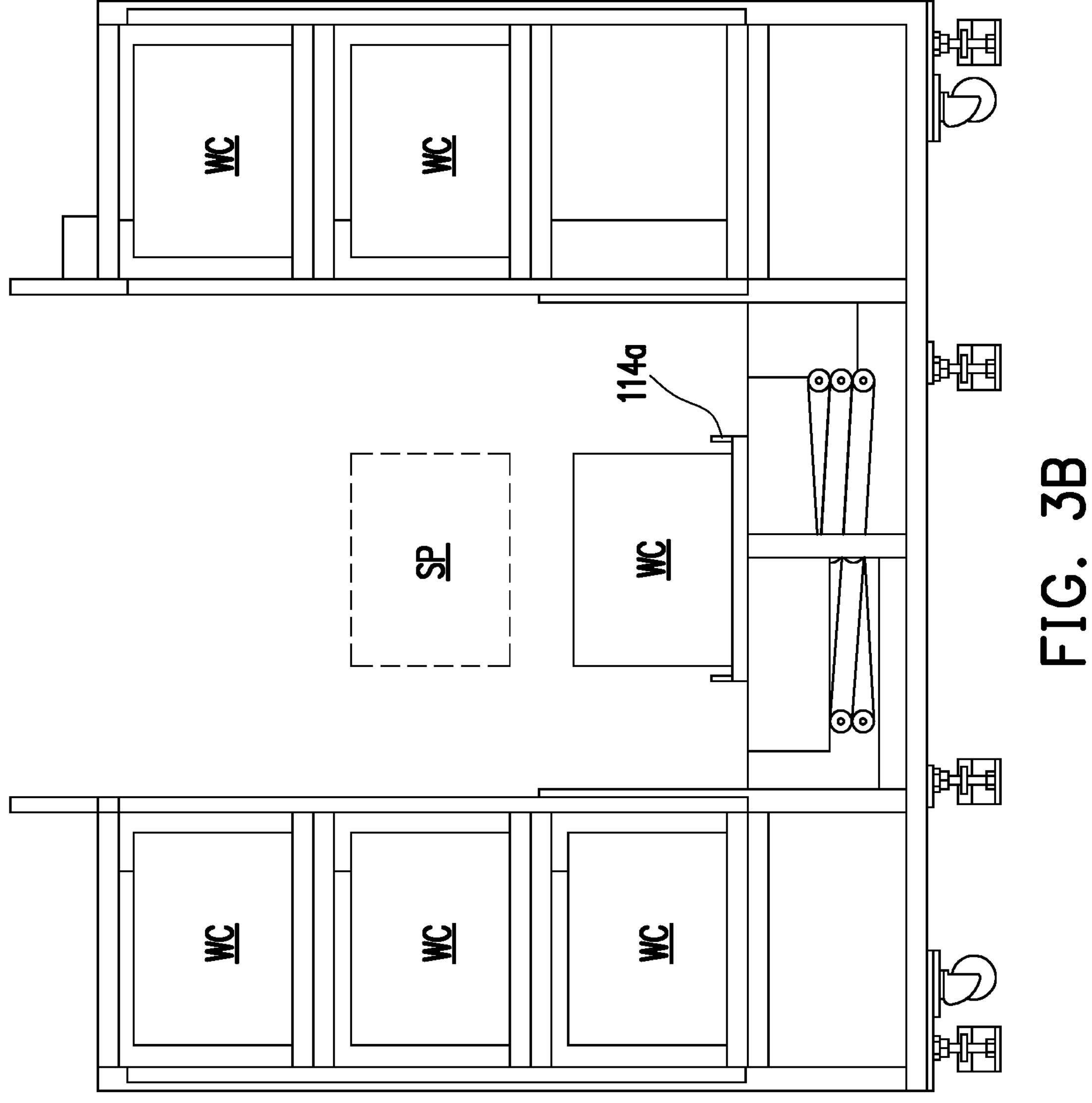
Figure 3C:
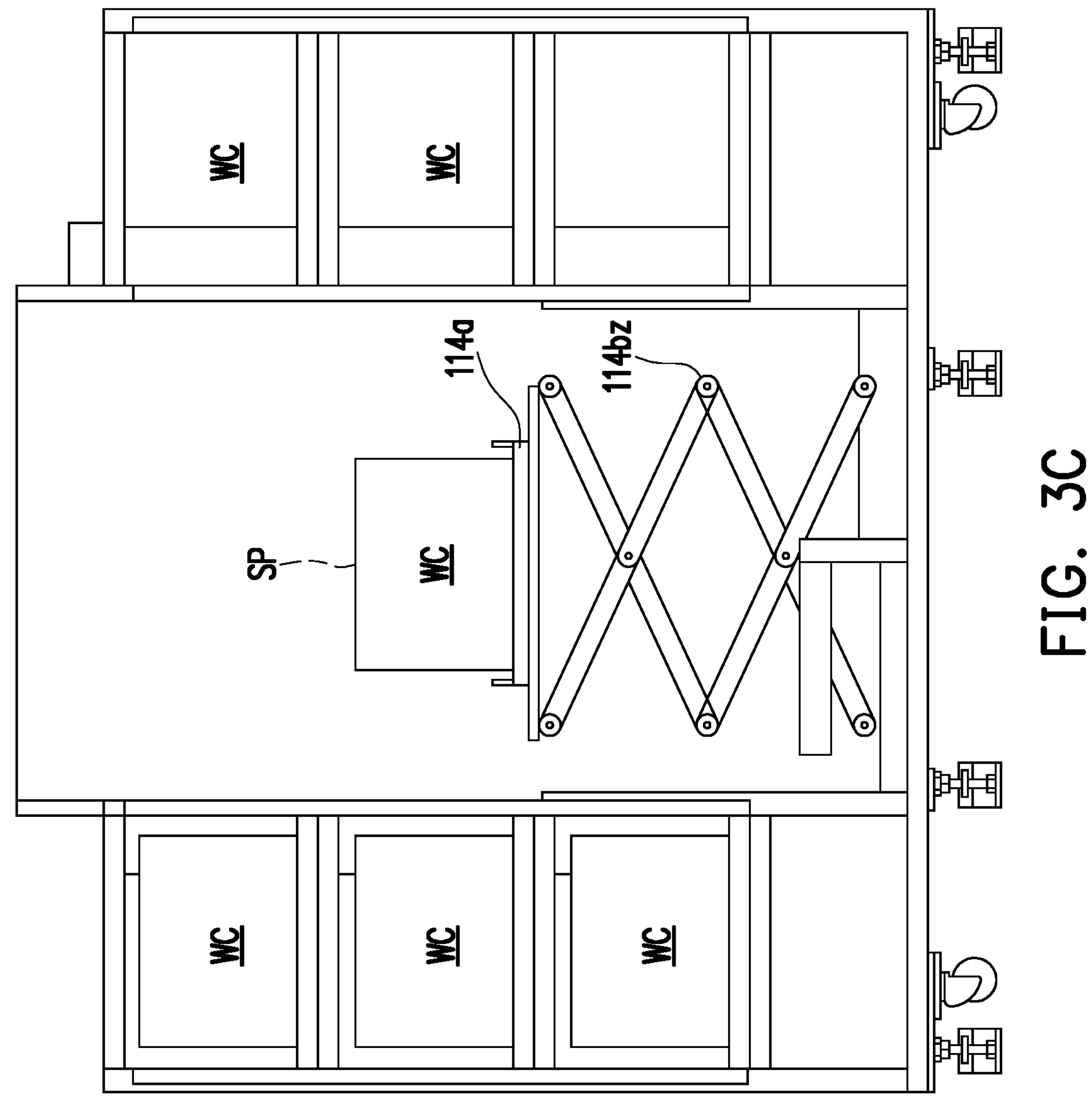
Figure 3D:
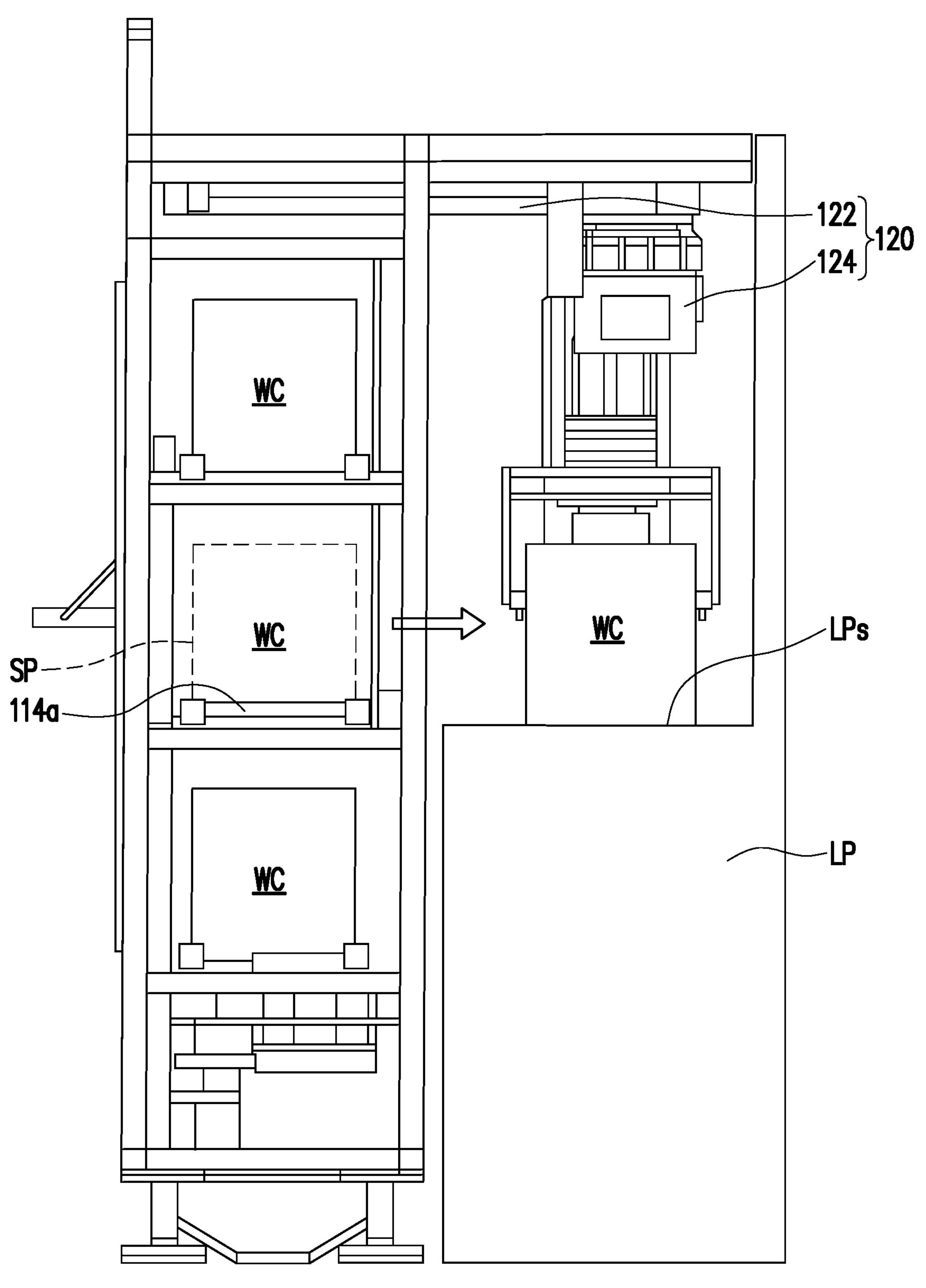
FIG. 3D is a schematic right side view illustrating the operation shown in FIG. 3C according to some embodiments of the present disclosure.

FIG. 3A to FIG. 3C are schematic front views illustrating a storage apparatus at various stages of performing an operation method according to some embodiments of the present disclosure and FIG. 3D is a schematic right side view illustrating the operation shown in FIG. 3C according to some embodiments of the present disclosure. It should be noted that some components (e.g., the user interface panel 130 and the signal pole 140) are omitted in FIG. 3A to FIG. 3D for ease of illustration and better understanding the movements of the storage apparatus. The automated wafer carrier handling system may be used to automatically handle and transport the wafer carriers between the storage rack and the load port without having to wait for the operator to load the wafer carriers on the load port. The operating method of the automated wafer carrier handling system includes at least the following steps. While the operation method is illustrated and described below as a series of acts or events, it will be appreciated that the illustrated ordering of such acts or events are not to be interpreted in a limiting sense.

Referring to FIG. 3A and FIG. 3B, the wafer carriers WC may be put into the storage rack 112 manually or by a mobile robotic arm (not shown). After placing the wafer carriers WC on the storage rack 112, the driving unit 114*b* controlled by the controller may drive the carrying member 114*a* to move toward a predetermined storage position (i.e. one of the compartments 112*a*) and transfer the wafer carrier WC from the storage position to the standby position SP. In some embodiments, the storage position is separated from the standby position SP. For example, the standby position SP is set to be positioned in the middle and inside the storage rack 112, such as at the middle position between two vertical columns of the compartments 112*a* of the storage rack 112. In other embodiments, the standby position SP is set to be positioned at other side (e.g., the left side, the right side, the top side, the bottom side, etc.) of the storage rack 112 depending on the design requirements. It should be noted that the standby position may be adjusted depending on the relative position of the storage rack 112, the load port LP, and the transfer apparatus 120.

Taking the wafer carrier WC at the bottom right corner of the storage rack 112 for example, the carrying member 114*a* driven by the x-axis mover 114*bx* of the driving unit 114*b* may move into the compartment 112*a* at the bottom right corner of the storage rack 112 to be positioned at the storage position. The wafer carrier WC in the compartment 112*a* may be engaged and/or affixed to the carrying member 114*a*. For example, the carrying member 114*a* may include a sensor for sensing the position of the wafer carrier WC, a fixture for affixing the wafer carrier WC while transferring, or any suitable component(s) for completion of the operation. Next, the wafer carrier WC carried by the carrying member 114*a* is taken out from the compartment 112*a* to the middle and bottom of the storage rack 112 as shown in FIG. 3B. It should be appreciated that the moving mechanism 114 may include any suitable component(s) or may be configured in any manner to perform the step of moving the wafer carrier WC out from the compartment 112*a*.

Referring to FIG. 3C and FIG. 3D, after the wafer carrier WC in the compartment 112*a* at the bottom right corner of the storage rack 112 is moved to the lower-middle position of the storage apparatus 110, the carrying member 114*a* carrying the wafer carrier WC may be driven by the z-axis mover 114*bz* to move upwardly to be positioned at the standby position SP as shown in FIG. 3C. Next, the robotic arm 124 may be driven to move forward and backward to transport the wafer carrier WC at the standby position SP. For example, the robotic arm 124 is driven to move into the storage rack 112 to be positioned at the standby position SP through the track 122, and then the robotic arm 124 is driven to grab the wafer carrier WC from the carrying member 114*a*. Next, driven by the y-axis mover 124*a*, the robotic arm 124 carrying the wafer carrier WC may move out of the storage rack 112 to be positioned above the receiving surface LPs of the load port LP. Subsequently, the robotic arm 124 is driven to load the wafer carrier WC on the receiving surface LPs of the load port LP as shown in FIG. 3D. In some embodiments, the bottom of the standby position SP in the storage apparatus 110 is substantially leveled with the receiving surface LPs of the load port LP, so that the robotic arm 124 may be driven to hold and translate the wafer carrier WC between the storage apparatus 110 and the load port LP. In other embodiments in which the standby position SP in the storage apparatus 110 is not leveled with the receiving surface LPs of the load port LP, the robotic arm 124 may be driven to lift and/or lower in order to grab the wafer carrier WC from the carrying member 114*a* or load the wafer carrier WC on the load port LP.

In some embodiments, a reverse sequence of operations may be performed to return the wafer carrier WC into the compartment 112*a*. It should be noted that although the aforementioned method is taken the wafer carrier WC in the compartment 112*a* at the bottom right corner of the storage rack 112 as example, some acts described above may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

For example, to transfer the wafer carrier WC in the compartment 112*a* at the top right corner of the storage rack 112, the carrying member 114*a* may be initially lifted by the z-axis mover 114*bz*. Next, the x-axis mover 114*bx* may drive the carrying member 114*a* to move forth to be positioned below the wafer carrier WC in the compartment 112*a* at the top right corner of the storage rack 112, and then the wafer carrier WC is carried by the carrying member 114*a* and the carrying member 114*a* is driven by the x-axis mover 114*bx* to take the wafer carrier WC out from the compartment 112*a*. The carrying member 114*a* carrying the wafer carrier WC is optionally driven to be positioned at the standby position for the robotic arm 124 to transfer. It should be understood that variations of moving the wafer carriers WC at different positions on the storage rack 112 may be carried out by the similar concept described above while still remaining within the scope of the disclosure.

Figure 4A:
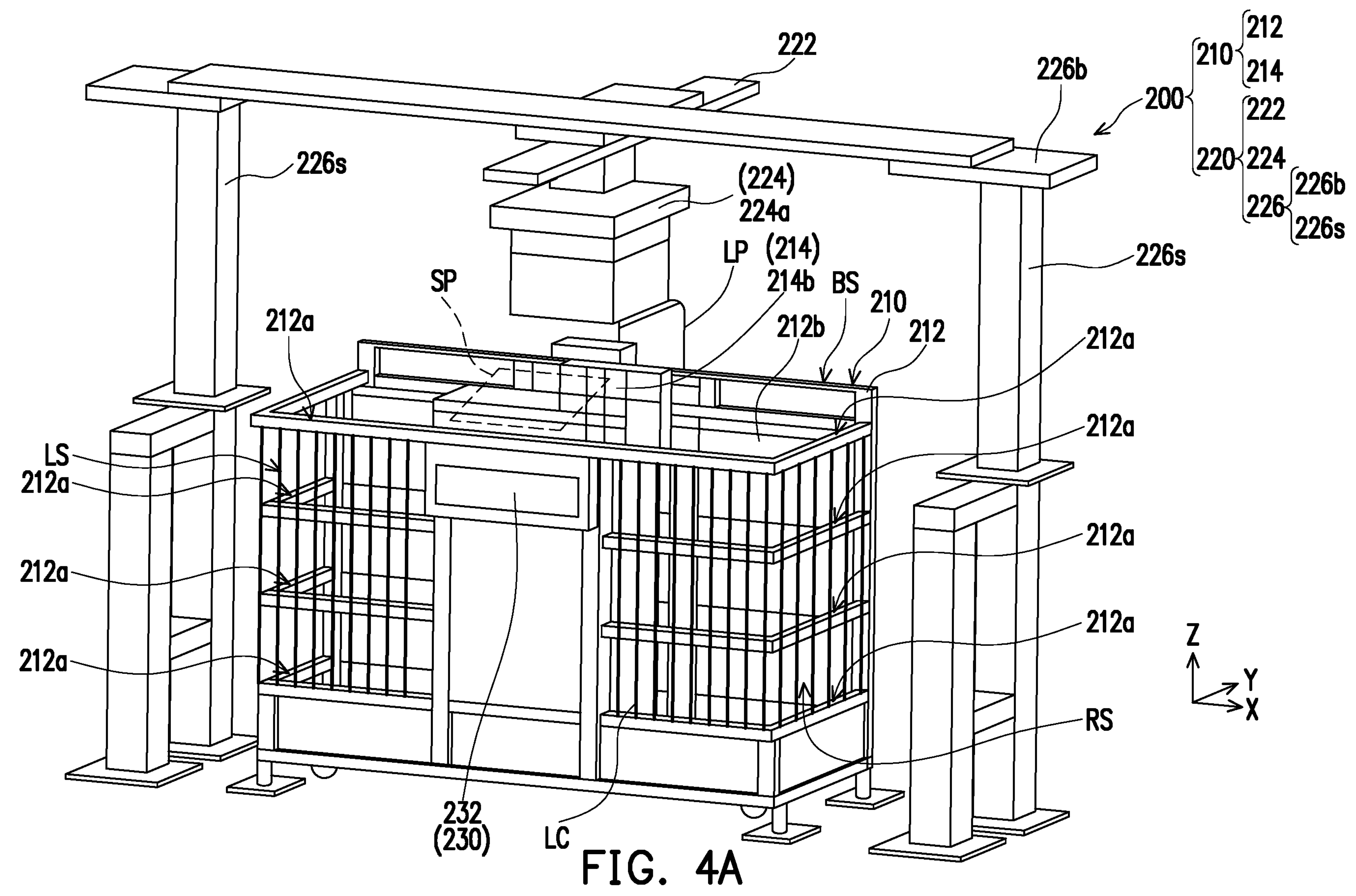
FIG. 4A is a schematic perspective view illustrating an automated wafer carrier handling system according to some embodiments of the present disclosure.
Figure 4B:
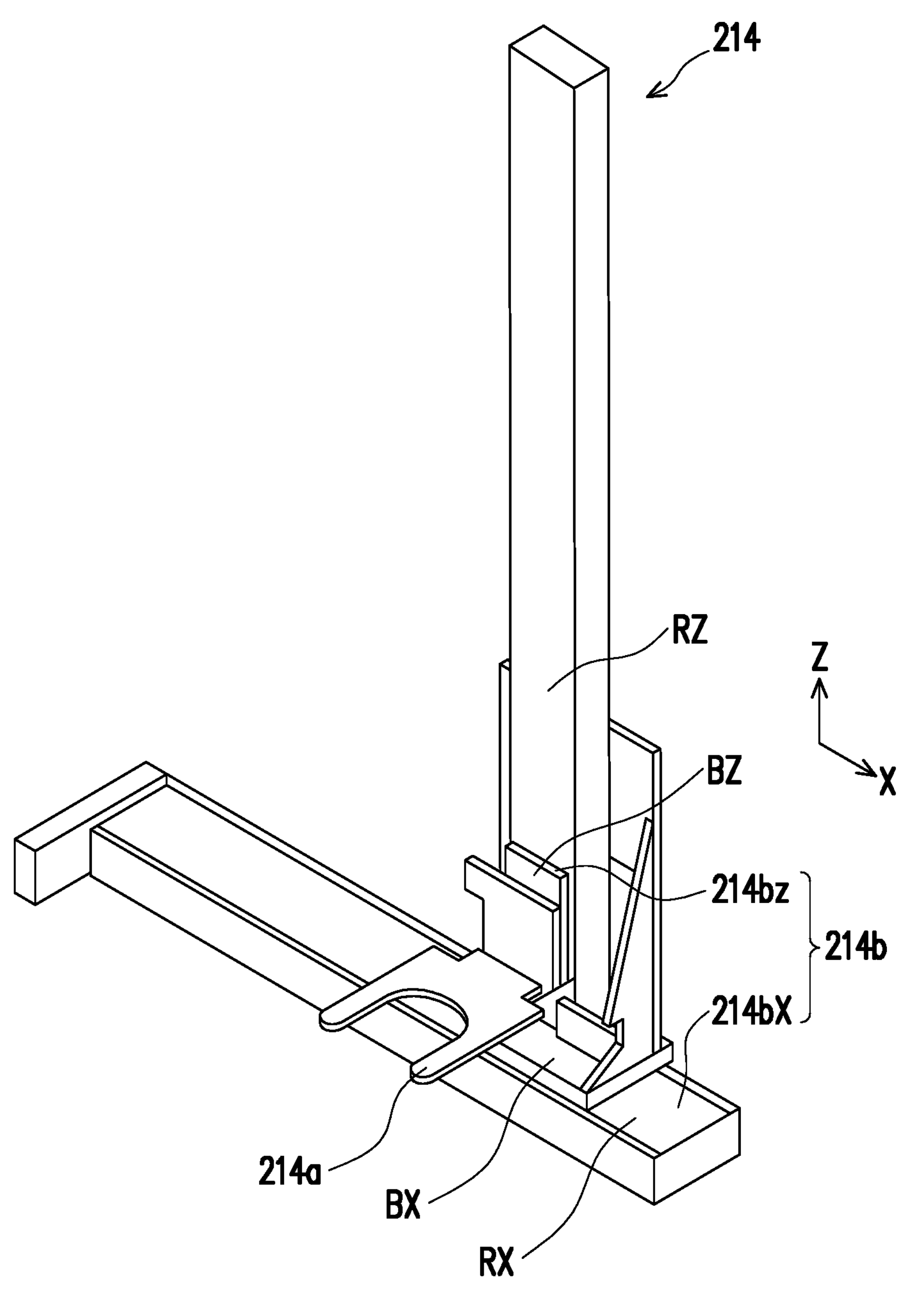
FIG. 4B is a schematic perspective view illustrating a moving mechanism according to some embodiments of the present disclosure.

FIG. 4A is a schematic perspective view illustrating an automated wafer carrier handling system according to some embodiments of the present disclosure and FIG. 4B is a schematic perspective view illustrating a moving mechanism according to some embodiments of the present disclosure. Referring to FIG. 4A and FIG. 4B, an automated wafer carrier handling system 200 includes a storage apparatus 210 and a transfer apparatus 220. The storage apparatus 210 may include a storage rack 212 within which is defined a plurality of compartments 212*a*. The wafer carriers WC may be temporarily stored in the compartments 212*a*. The storage rack 212 may be similar to the storage rack 112 described above, which includes various guide members, sensors, tag readers, or the like, to ensure that the wafer carriers WC are stored in place. It should be noted that although eight of the compartments 212*a* are illustrated, the number and the arrangement of the compartments 212*a* may be adjusted depending on the requirements and construe no limitation in the disclosure.

In some embodiments, the storage apparatus 210 includes a moving mechanism 214 which is configured to move the wafer carriers WC that are accommodated in the compartments 212*a* to the standby position SP for transferring to the load port LP. The moving mechanism 214 may be mounted on the middle of the storage rack 212 to facilitate access to the compartments 212*a* at left and right sides of the storage rack 212. It should be noted that other arrangement of the moving mechanism 214 and the compartments 212*a* are possible depending on the design requirements. In some embodiments, the moving mechanism 214 is equipped with a carrying member 214*a* configured to carry the wafer carrier WC. The moving mechanism 214 may include a driving unit 214*b* providing at least one degree of freedom of movement and configured to move the carrying member 214*a* to intended positions. It should be noted that although the carrying member 214*a* is illustrated as a fork, the carrying member 214*a* may take various forms as long as the carrying member 214*a* can firmly hold the wafer carrier WC when moving. In some embodiments, the carrying member 214*a* includes guiding/engaging components (not shown) disposed on a receiving surface of the carrying member 214*a* for guiding/engaging the wafer carrier WC in place on the carrying member 214*a*.

For example, the carrying member 214*a* assembled to the driving unit 214*b* so that the carrying member 214*a* is driven by the driving unit 214*b* to perform reciprocating movements. In some embodiments, the driving unit 214*b* includes a z-axis mover 214*bz* and the carrying member 214*a* is mounted on the z-axis mover 214*bz*, so that the carrying member 214*a* driven by the z-axis mover 214*bz* may reciprocate linearly in Z-axis direction. In some embodiments, the z-axis mover 214*bz* includes the linear guideway including a rail RZ and a slide block BZ that slides and moves on the rail RZ. The carrying member 214*a* may be affixed to the slide block BZ so that the z-axis mover 214*bz* may drive the carrying member 214*a* into a linear movement along the rail RZ. For example, the rail RZ is mounted on the cover plate 212*b* at the back side BS of the storage rack 212 and may extend between the top and the bottom of the storage rack 212. It should be noted that the type of the z-axis mover 214*bz* illustrated herein is merely exemplary. The z-axis mover 114*bz* may be any type of lift device for lifting and lowering down the carrying member 214*a*.

In some embodiments, the driving unit 214*b* includes an x-axis mover 214*bx* carrying the carrying member 214*a* and capable of driving the carrying member 214*a* to perform back-and-forth linear motion in X-axis direction. In some embodiments, the x-axis mover 214*bx* and the z-axis mover 214*bz* assembled to the storage rack 212 may provide two degrees of freedom of movement, such as vertically between the top and the bottom of the storage rack 212 and horizontally to either side of the storage rack 212. The x-axis mover 214*bx* may be similar to the z-axis mover 214*bz*, which includes a linear guideway including a slide block BX operably mounted on the rail RX for slidably guiding the carrying member 214*a*. For example, the rail RX is mounted on the bottom of the storage rack 212 and may extend to the compartments 212*a* at the right/left corners of the storage rack 212. The x-axis mover 214*bx* may include components assembled to the linear guideway, such as motor gears, shafts, bearing, and/or any suitable driving component(s). It should be noted that the x-axis mover 214*bx* may be implemented as any suitable mechanism for translating the carrying member 214*a*. Other configuration of the driving unit 214*b* is possible as long as the wafer carriers WC stored in the compartments 212*a* may be transferred to the standby position SP.

In some embodiments, the transfer apparatus 220 includes a moving mechanism including a track 222 and a robotic arm 224 for providing at least one degree of freedom of movement above the storage rack 212. The transfer apparatus 220 may include a gantry 226 which is a frame structure raised on side supports 226*s* to span over the storage apparatus 210. For example, the side supports 226*s* of the gantry 226 are respectively located on the right side RS and the left side LS of the storage rack 212. The bridge member 226*b* of the gantry 226 may extend between the side supports 226*s* and across above the storage rack 212. It should be noted that the orientation and the structure of the gantry 226 illustrated in FIG. 4A are merely exemplary, other orientation and/or structure of the gantry may be possible. In some embodiments, the track 222 is mounted on the bridge member 226*b* of the gantry 226 and may extend over the storage apparatus 210 and the load port LP.

In some embodiments in which the load port LP is located right behind the storage rack 212 (e.g., on the back side BS of the storage rack 212), the track 222 disposed on the gantry 226 is substantially perpendicular to the bridge member 226*b* to provide a transferring pathway between the storage rack 212 and the load port LP. It should be noted that the orientation of the track 222 may be adjusted depending on the relative position of the storage apparatus 210 and the load port LP. In some embodiments, the robotic arm 224 may include a gripper or other suitable manner of manipulating the wafer carrier WC. The robotic arm 224 may be movably connected to the track 222 and may be configured to pick up, move, and load the wafer carrier WC. In some embodiments, the robotic arm 224 is driven by the mover 224*a* to move backward and forward in Y-axis direction along the track 222 and to optionally move up-and-down in Z-axis direction to reach the standby position SP. In other embodiments, the robotic arm 224 is equipped with multiple movers (e.g., a y-axis mover, an x-axis mover, a z-axis mover, or a combination of these) configured to provide multi-degree of freedom of movement.

In some embodiments, the automated wafer carrier handling system 200 includes a user interface panel 230 mounted on the storage rack 212 of the storage apparatus 210. For example, the user interface panel 230 is installed on the front side FS of the storage rack 212 without covering the compartments 212*a*. The user interface panel 230 include a controller 232 which may be a computing device controlling the movement of the storage apparatus 210 and the transfer apparatus 220 by program instructions, codes, etc. The user interface panel 230 may be similar to the user interface panel 130 described above, so the detailed descriptions are not repeated herein for brevity. The storage apparatus 210 may be similar to the storage apparatus 110 which includes the quick release/positioning mechanisms. The detailed descriptions of the quick release/positioning mechanisms are not repeated for brevity.

In some embodiments, one or more detection device LC may be arranged on at least front side FS of the storage rack 212 which is not protected by the cover plate for guarding the compartments 212*a*. For example, the detection device LC includes the light curtains, optical sensors, proximity sensor, and/or the like, for detecting inadvertent entry into the compartments 212*a*. In some embodiments, the detection device LC (e.g., light curtains) automatically activates and deactivate depending on acts of the operator. For example, when activated, the light curtains create a safety curtain that detects entry into the compartments 212*a*. When the operator loads the wafer carriers WC in the compartments 212*a*, the light curtains are deactivated and the movements of the moving mechanism 214 may pause.

Figure 5A:
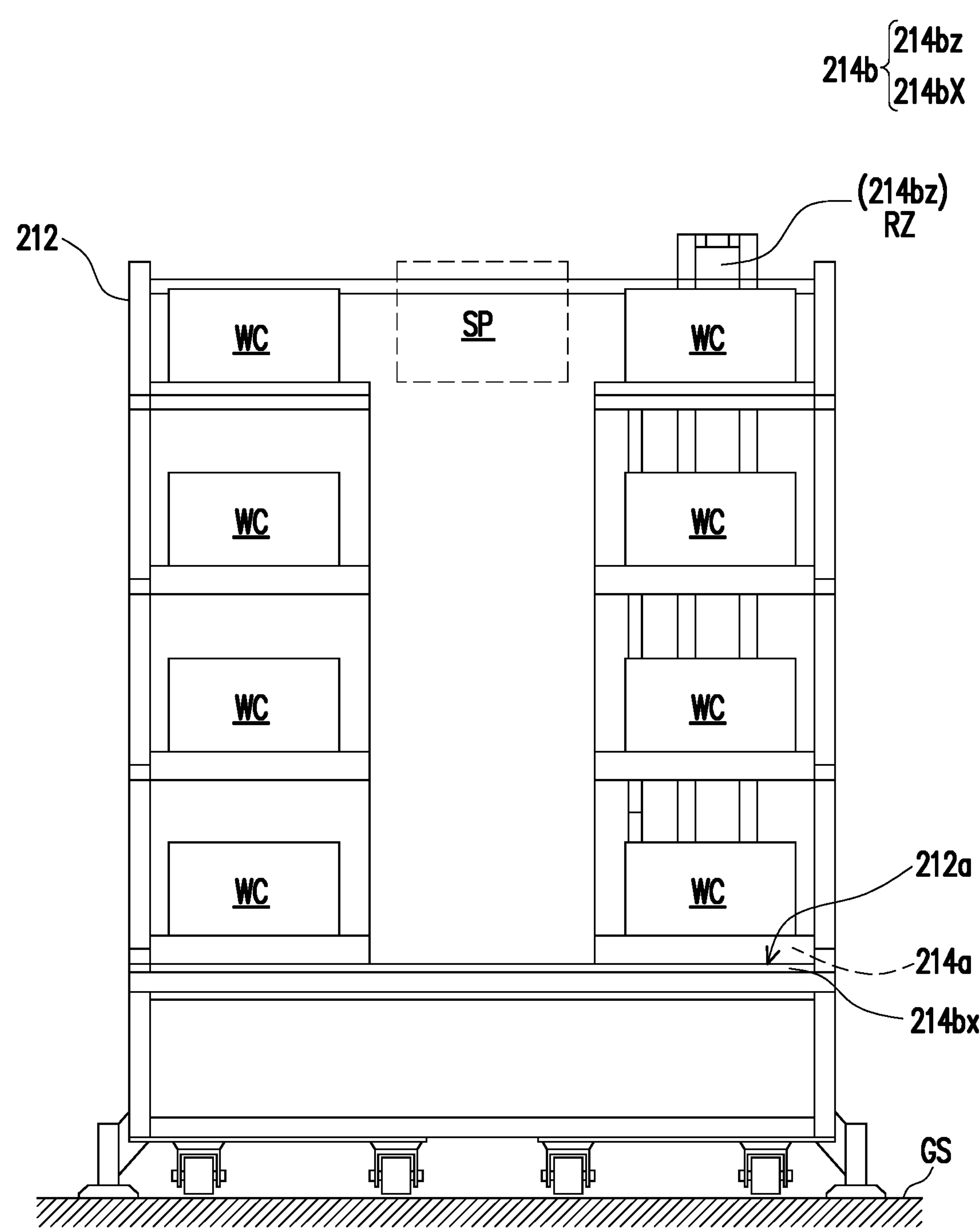
FIG. 5A to FIG. 5C are schematic front views illustrating a storage apparatus at various stages of performing an operation method according to some embodiments of the present disclosure.
Figure 5B:
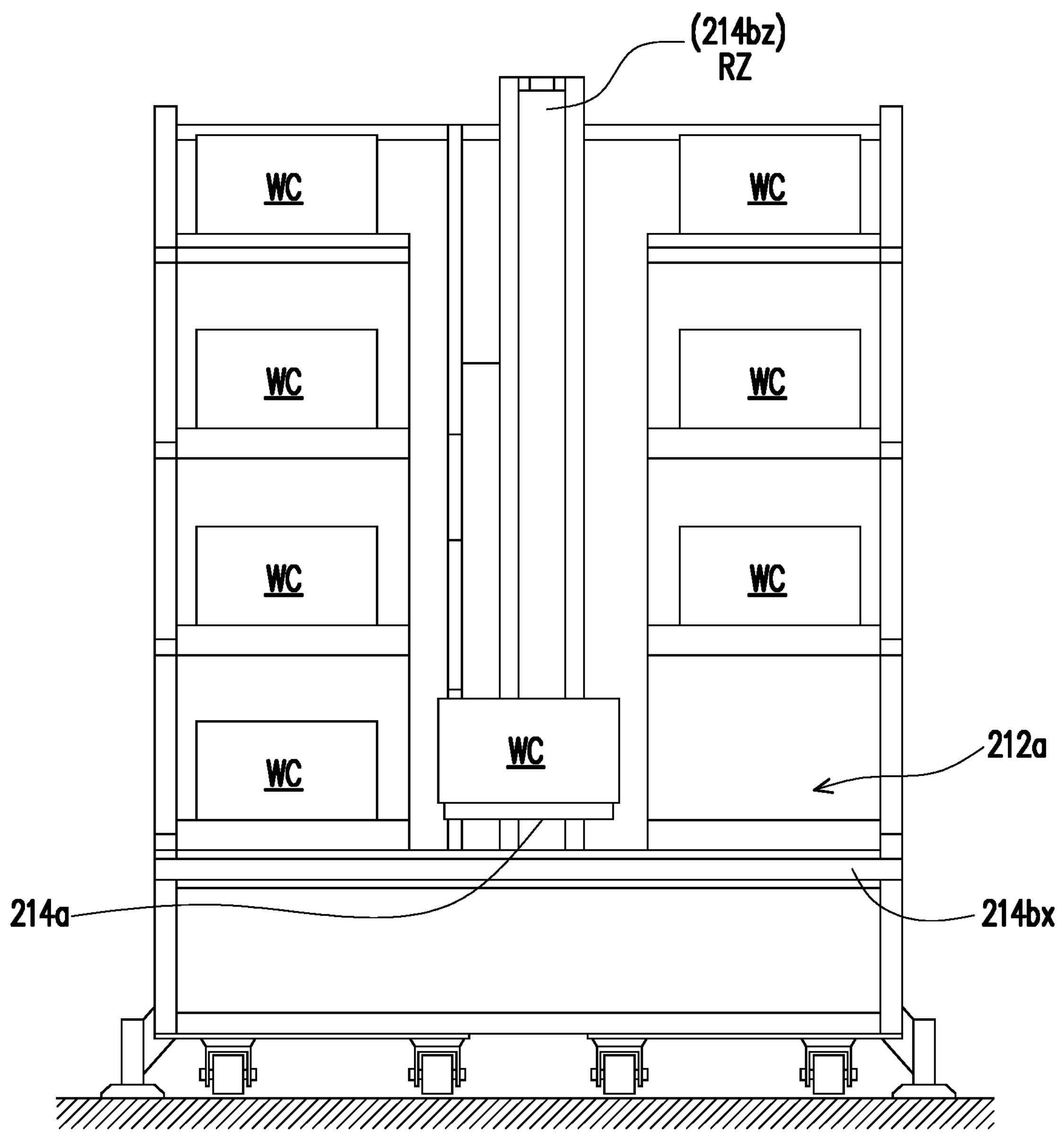
Figure 5C:
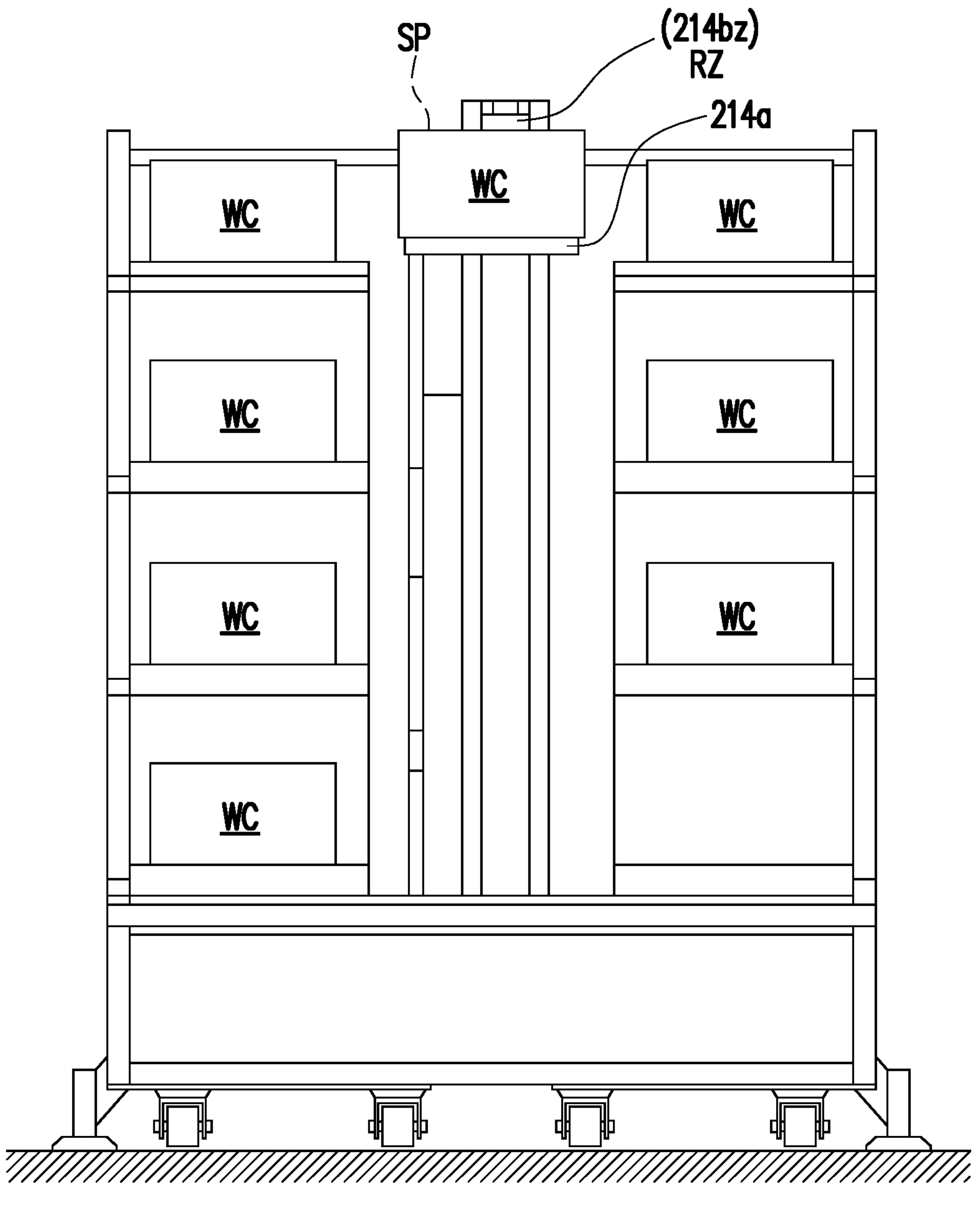
Figure 5D:
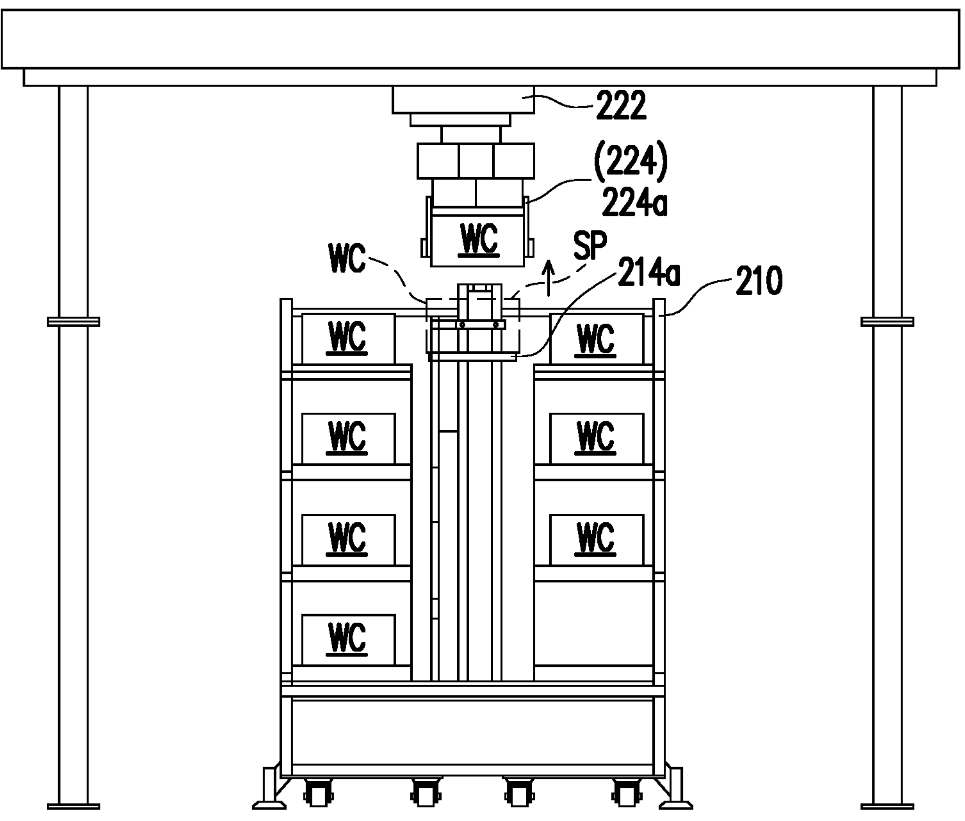
FIG. 5D is a schematic front view illustrating a wafer carrier which is moved from storage apparatus by transfer apparatus according to some embodiments of the present disclosure.

FIG. 5A to FIG. 5C are schematic front views illustrating a storage apparatus at various stages of performing an operation method according to some embodiments of the present disclosure and FIG. 5D is a schematic front view illustrating a wafer carrier which is moved from storage apparatus by transfer apparatus according to some embodiments of the present disclosure. It should be noted that the some components (e.g., the user interface panel 230) are omitted in FIG. 5A to FIG. 5C for a better understanding of the movements performing behind the user interface panel 230. The automated wafer carrier handling system may be used to automatically handle and transport the wafer carriers between the storage rack and the load port without having to wait for operator to load the wafer carriers on the load port. The operating method of the automated wafer carrier handling system includes at least the following steps. While the operation method is illustrated and described below as a series of acts or events, it will be appreciated that the illustrated ordering of such acts or events are not to be interpreted in a limiting sense.

Referring to FIG. 5A and FIG. 5B, one of the wafer carriers WC may be put in each of the compartments 212*a* of the storage rack 212 manually or by a mobile robotic arm (not shown). The driving unit 214*b* of the storage apparatus 210 controlled by the controller may drive the carrying member 214*a* to move toward the predetermined compartment 212*a* for transferring the wafer carrier WC from the predetermined storage position (i.e. one of the compartments 212*a*) to the standby position SP. In some embodiments, the standby position SP is separated from the storage position. The standby position SP may be, relative to a ground surface GS, higher than the storage position (e.g., one of the compartments 212*a* at the top of the storage rack 212) for the robotic arm to grab. For example, the standby position SP is set to be positioned at the upper end of the rail RZ between two vertical columns of the compartments 112*a*. It should be noted that the standby position SP may be adjusted depending on the configuration of the storage rack 212, the load port LP, and the transfer apparatus 220.

Taking the wafer carrier WC at the bottom right corner of the storage rack 212 for example, the carrying member 214*a* driven by the x-axis mover 214*bx* of the driving unit 214*b* may move into the compartment 212*a* at the bottom right corner of the storage rack 212 to be positioned at the storage position. Next, the wafer carrier WC in the compartment 212*a* at the bottom right corner of the storage rack 212 is carried by the carrying member 214*a*, and then linearly moved out of the compartment 212*a* via the x-axis mover 214*bx* to the middle of the storage rack 212 as shown in FIG. 5B. For example, the carrying member 214*a* may include a sensor for sensing the position of the wafer carrier WC, a fixture for affixing the wafer carrier WC while moving, or any suitable component(s) for completion of the operation. It should be appreciated that the moving mechanism 214 may include suitable component(s) or may be configured in any manner to perform the step of moving the wafer carrier WC out from the compartment 212*a*.

Referring to FIG. 5C and FIG. 5D, after moving the wafer carrier WC out from the compartment 212*a* at the bottom right corner of the storage rack 212, the carrying member 214*a* carrying the wafer carrier WC may be driven by the z-axis mover 214*bz* to move upwardly along the rail RZ to the standby position SP. Next, the gripper of the robotic arm 224 may be driven by the mover 224*a* to be lowered down so as to grab the wafer carrier WC from the carrying member 214*a*, and then the gripper holding the wafer carrier WC may move upwardly and leave the storage apparatus 210 as shown in FIG. 5C. Subsequently, the robotic arm 224 driven by the mover 224*a* may be moved along the track 222 to be positioned above the receiving surface of the load port (shown in FIG. 6A).

In some embodiments, after the semiconductor wafers undergo processing in the semiconductor processing tool, the wafer carrier WC including the semiconductor wafers have been processed may be returned to the same storage apparatus 210. A reverse sequence of operations loads the wafer carriers WC from the receiving surface of the load port to the standby position and stores them back into the compartment 212*a*. In other embodiments, after processing in the semiconductor processing tool, the wafer carrier WC is transported to another storage apparatus or another shelving unit awaiting transfer to next station.

Figure 6A:
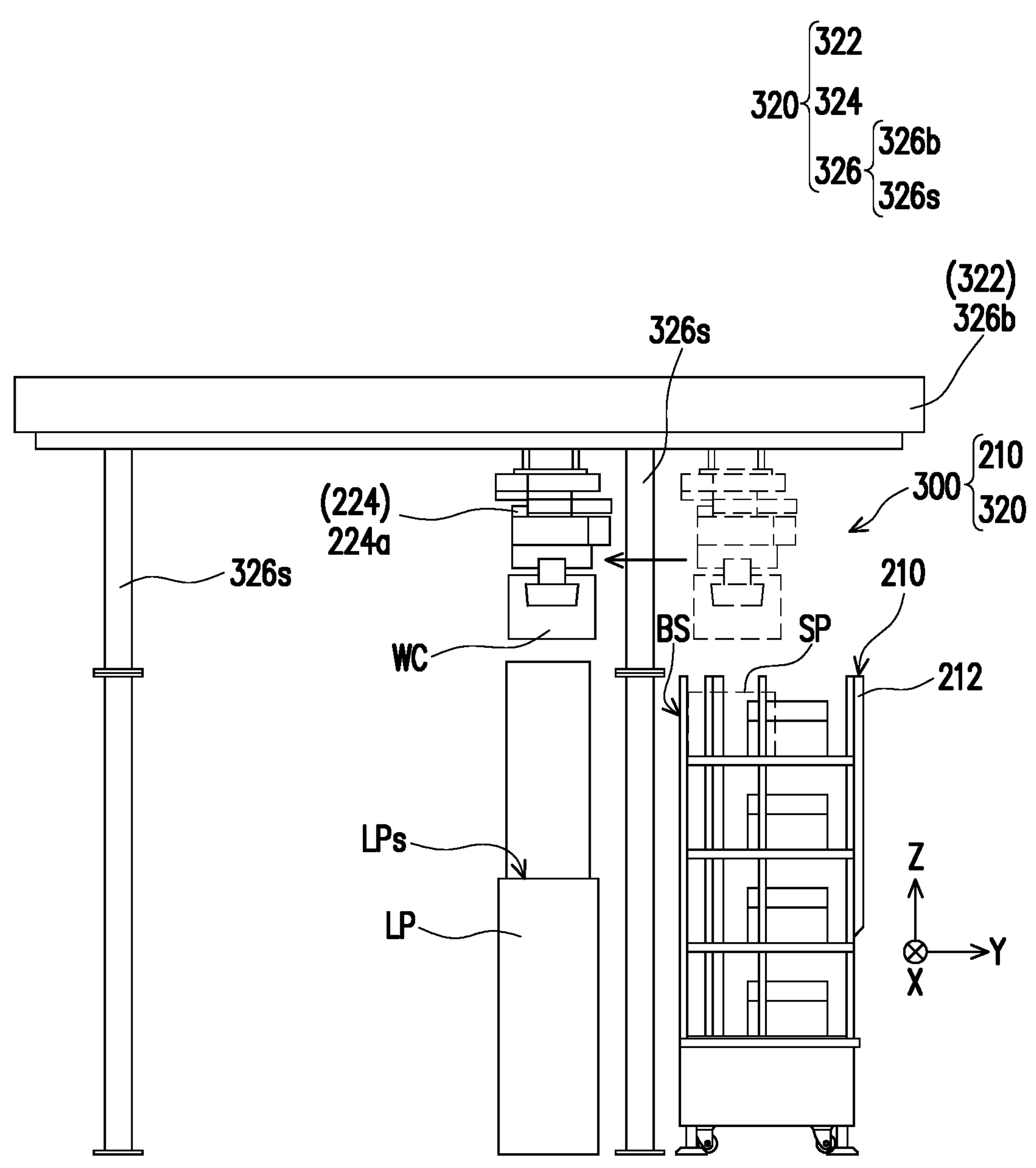
FIG. 6A and FIG. 6B are schematic right side views illustrating a transfer apparatus at various stages of performing an operation method according to some embodiments of the present disclosure.
Figure 6B:
Figure 6B:
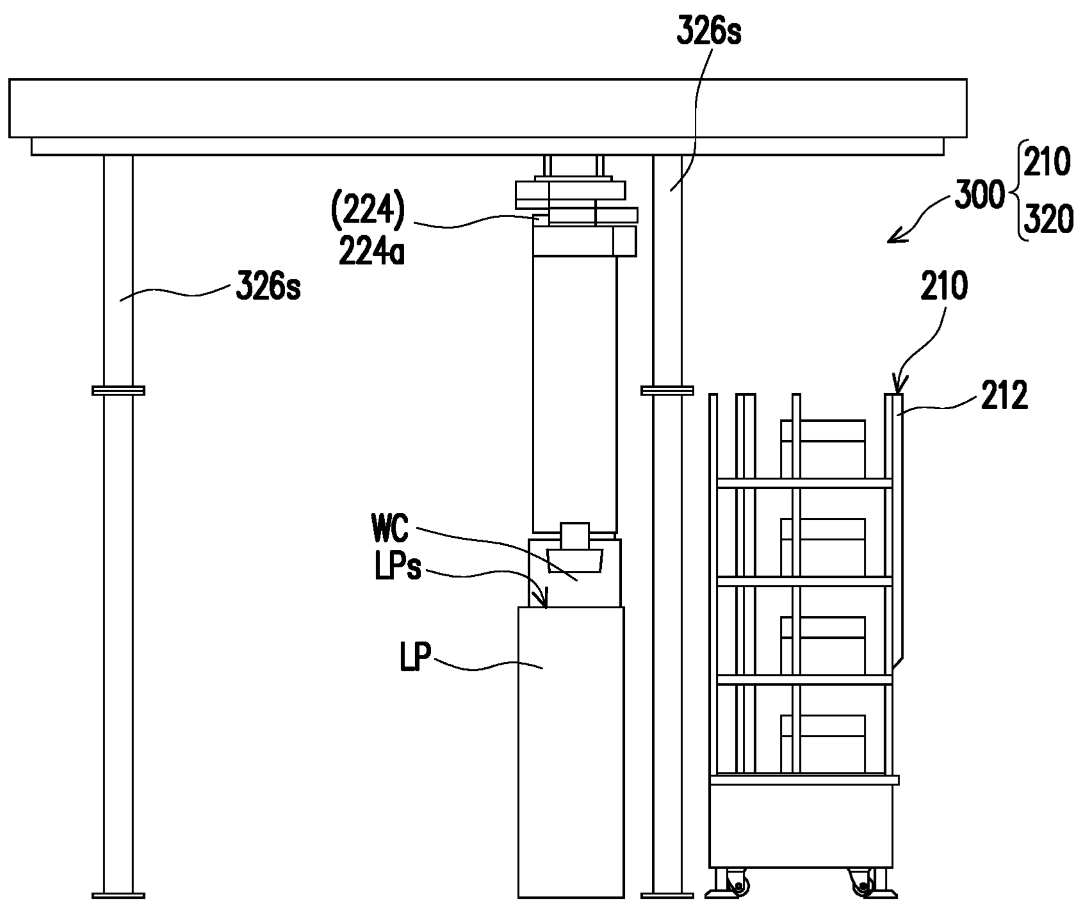

FIG. 6A and FIG. 6B are schematic right side views illustrating a transfer apparatus at various stages of performing an operation method according to some embodiments of the present disclosure. While the operation method is illustrated and described below as a series of acts or events, it will be appreciated that the illustrated ordering of such acts or events are not to be interpreted in a limiting sense. It should be noted that like reference numbers are used to designate like elements.

Referring to FIG. 6A, an automated wafer carrier handling system 300 includes a storage apparatus 210 and a transfer apparatus 320. The transfer apparatus 320 includes a moving mechanism including a track 322 and a robotic arm 224 movably connected to the track 322. The transfer apparatus 320 may further include a gantry 326 including side supports 326*s* and the bridge member 326*b*. For example, the side supports 326*s* are located behind the back side BS of the storage rack 212, and the bridge member 326*b* extends above the standby position SP and the load port LP. The load port LP may be located behind the back side BS of the storage rack 212. In some embodiments, two side supports 326*s* are disposed at two opposing sides of the load port LP and one of the side supports 326*s* is disposed between the load port LP and the back side BS of the storage rack 212. In some embodiments, the bridge member 326*b* is disposed above the storage rack 212 and extends toward the side support 326*s* distal from the storage apparatus 210. For example, the bridge member 326*b* is disposed extending in Y-axis direction. The track 322 may be integrated on the bridge member 326*b* of the gantry 326 so that the track 322 extends along the bridge member 326*b* in a direction between the storage apparatus 210 and the load port LP.

Continue to FIG. 6A and referring to FIG. 6B, the wafer carrier WC is transferred to the standby position SP and picked up by the robotic arm 224 as described in FIG. 5A to FIG. 5D. Next, the robotic arm 224 is moved away from the storage apparatus 210 along the track 322 to be positioned above the receiving surface LPs of the load port LP. Subsequently, the gripper of the robotic arm 224 driven by the mover 224*a* may be lowered down to load the wafer carrier WC on the receiving surface LPs of the load port LP. After loading the wafer carrier WC, the gripper of the robotic arm 224 may release and move upwardly to grab another wafer carrier WC at the standby position SP. The operation of transferring the wafer carrier from the compartment (i.e. the storage position) to the standby position and the operation of transferring the wafer carrier from the standby position to the load port may be performed simultaneously to increase the efficiency of fabrication, or may be performed sequentially depending on the requirements. After the wafer carrier WC is loaded on the load port LP, the following steps, such as unloading the semiconductor wafers, transferring the semiconductor wafers to the semiconductor processing tool, performing processes on the semiconductor wafers, etc., may be performed.

In some embodiments, after the semiconductor wafers undergo processing in the semiconductor processing tool, the wafer carrier WC including the semiconductor wafers have been processed loads back to the load port LP, and a reverse sequence of operations removes the wafer carriers WC from the receiving surface LPs of the load port LP and return them to the standby position SP. In other embodiments, after processing in the semiconductor processing tool, the wafer carrier WC including the semiconductor wafers have been processed is transported to another load port and/or another storage apparatus awaiting transfer to next station. It should be noted that the aforementioned operation methods may be applied to other embodiments described elsewhere in the disclosure.

Figure 7A:
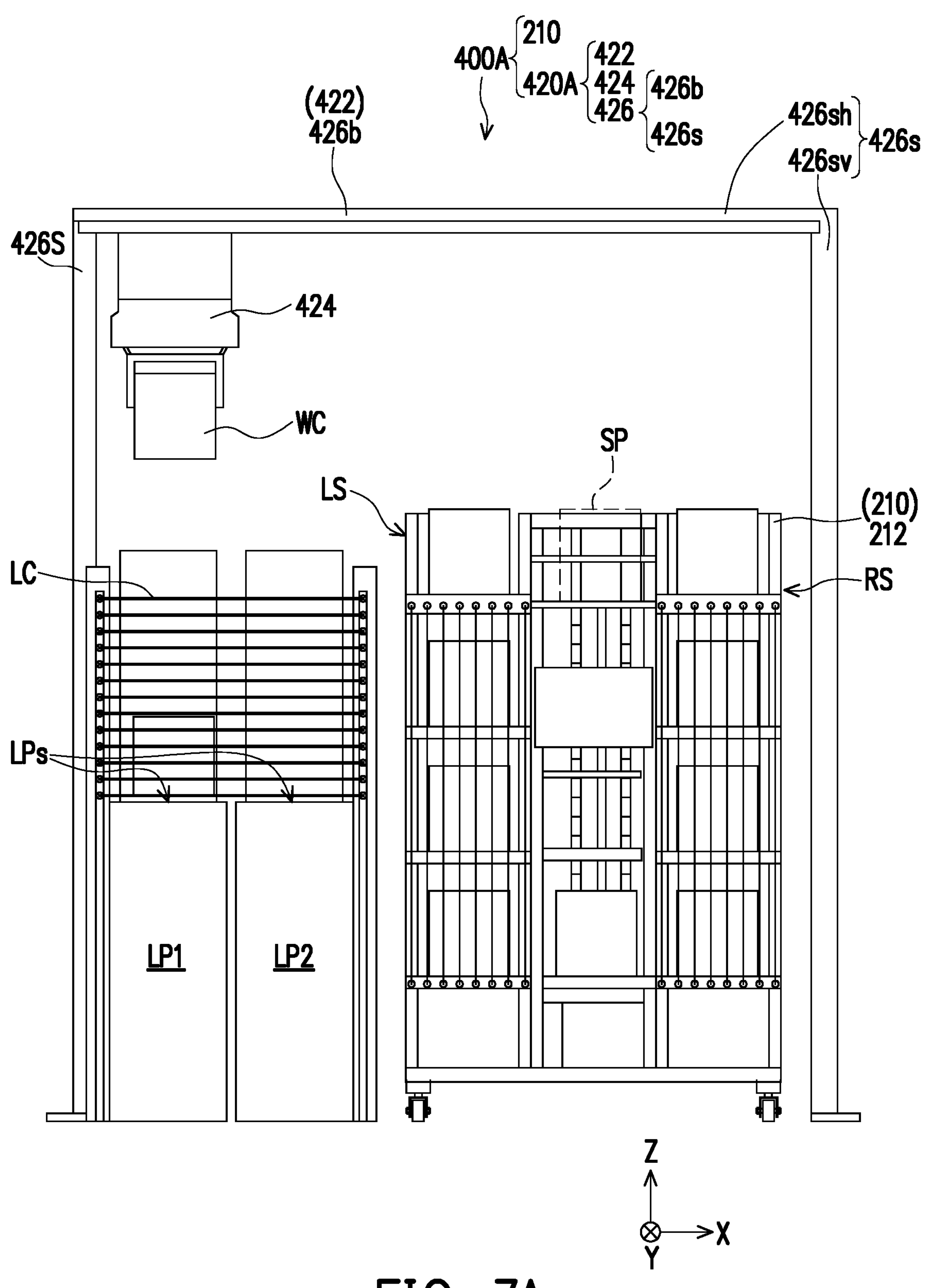
FIG. 7A is a schematic front view illustrating a configuration of an automated wafer carrier handling system according to some embodiments of the present disclosure.
Figure 7B:
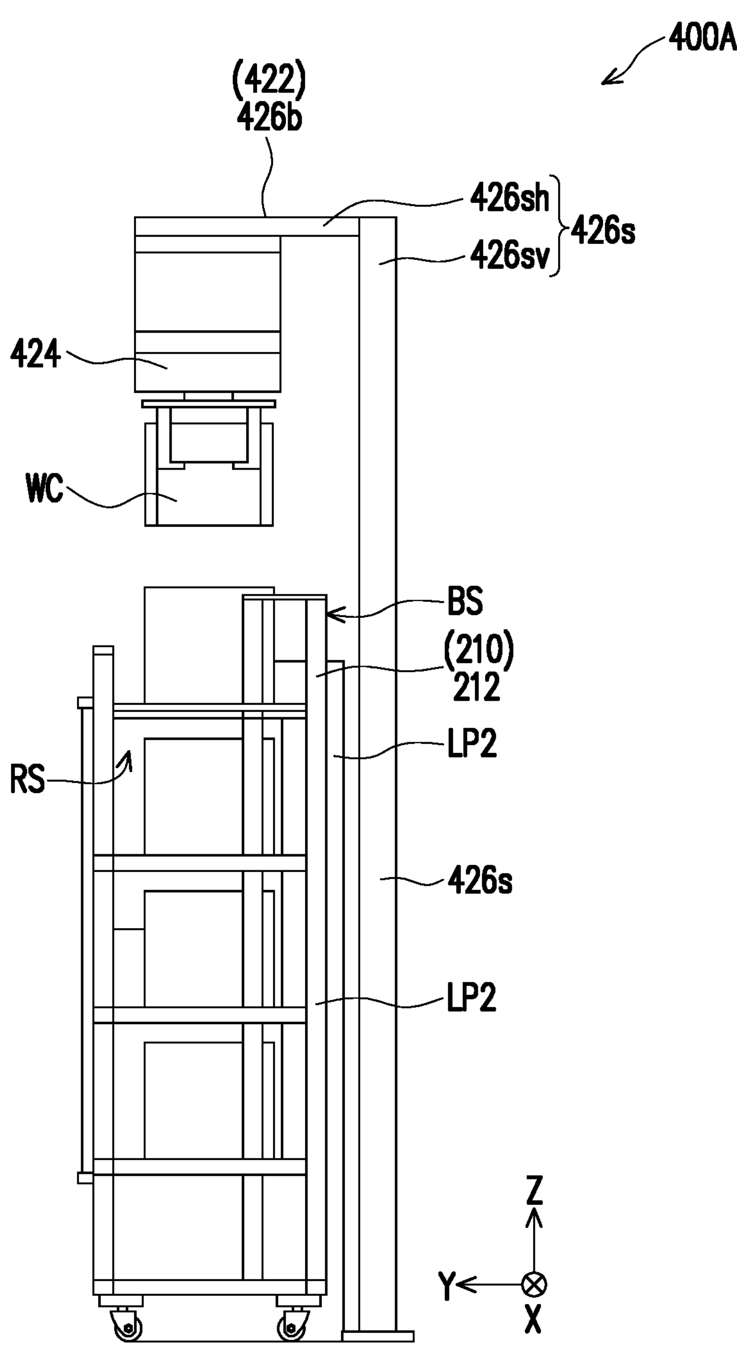
FIG. 7B is a schematic right side view illustrating the configuration shown in FIG. 7A according to some embodiments of the present disclosure.

FIG. 7A is a schematic front view illustrating a configuration of an automated wafer carrier handling system according to some embodiments of the present disclosure and FIG. 7B is a schematic right side view illustrating the configuration shown in FIG. 7A according to some embodiments of the present disclosure. Referring to FIG. 7A and FIG. 7B, an automated wafer carrier handling system 400A includes the storage apparatus 210 and a transfer apparatus 420A. The load ports LP1 and LP2 may be disposed side by side, and the storage apparatus 210 may be disposed aside one of the load ports LP1 and LP2. For example, the storage apparatus 210, the load ports LP1 and LP2 are arranged in a row along the X-axis direction. In some embodiments, the load ports LP1 and LP2 disposed at the left side LS of the of the storage rack 212 are oriented in the same way. It should be noted that other configuration/orientation of the load ports and the storage apparatus may be possible.

The transfer apparatus 420A includes a moving mechanism including a track 422 and a robotic arm 424 movably connected to the track 422. The transfer apparatus 420A may further include a gantry 426 including the bridge member 426*b* and the side supports 426*s*. For example, the bridge member 426*b* is disposed on the side supports 426*s* and extends above the storage rack 212 and the load ports LP1 and LP2. In some embodiments, the bridge member 426*b* of the gantry 426 may span over the storage rack 212 and the load ports LP1 and LP2 in X-axis direction. In some embodiments, the side supports 426*s* of the gantry 426 are located behind the back side BS of the storage rack 212. For example, each of the side supports 426*s* includes a vertical portion 426*sv* extending along the Z-axis direction, and a horizontal portion 426*sh* connected to the vertical portion 426*sv* and extending forward to be above the storage rack 212. The bridge member 426*b* of the gantry 426 may extend between the horizontal portions 426*sh* of the side supports 426*s*. The track 422 may be assembled to the bridge member 426*b* of the gantry 426 so that the track 422 extends above the storage apparatus 210 and the load ports LP1 and LP2 along the bridge member 426*b*.

In some embodiments, the load ports LP1 and LP2 are equipped with the detection device LC for guarding the receiving surface LPs and detecting inadvertent entry into the load ports LP1 and LP2. In some embodiments, one of the load ports LP1 and LP2 may be configured to receive the wafer carrier WC including semiconductor wafers to be processed, and the other one of the load ports LP1 and LP2 may be configured to receive the wafer carrier WC including semiconductor wafers which have been processed. The wafer carrier WC including semiconductor wafers which have been processed may be transported to the next processing station manually or by a mobile robotic arm (not shown). In other embodiments, both of the load ports LP1 and LP2 are configured to receive the wafer carrier WC including semiconductor wafers to be processed, and the wafer carrier WC including semiconductor wafers which have been processed may be loaded on another load port(s) disposed on other side(s) of the semiconductor processing tool or semiconductor manufacturing equipment. The robotic arm 424 may be configured to transfer the wafer carriers WC among the load ports LP1 and LP2 and the storage apparatus 210. It should be noted that more than one robotic arms may be movably mounted on the track 422 to respectively transfer the wafer carriers WC to the load ports LP1 and LP2 and the storage apparatus 210.

Figure 8A:
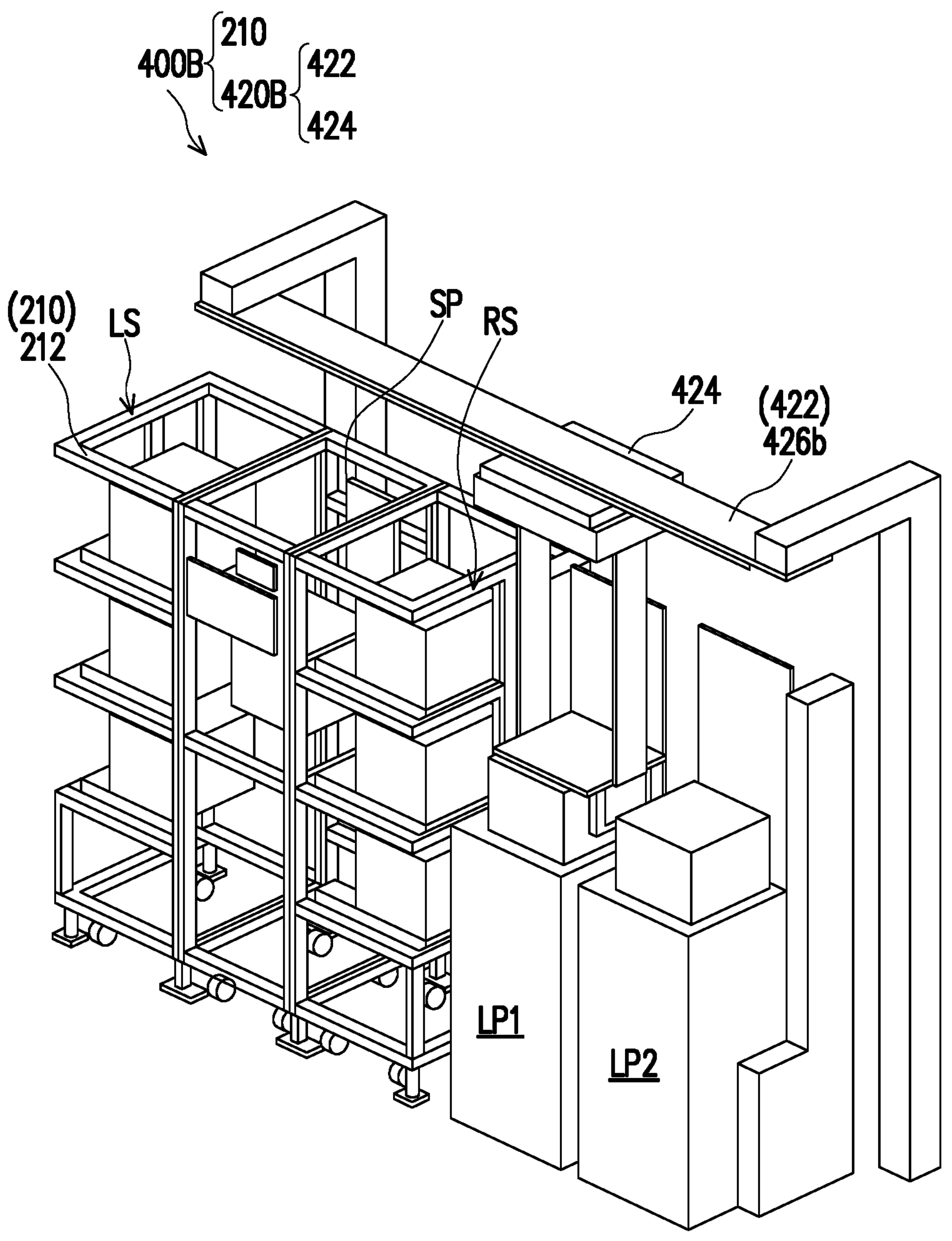
FIG. 8A is a schematic perspective view illustrating a configuration of an automated wafer carrier handling system according to some embodiments of the present disclosure.
Figure 8B:
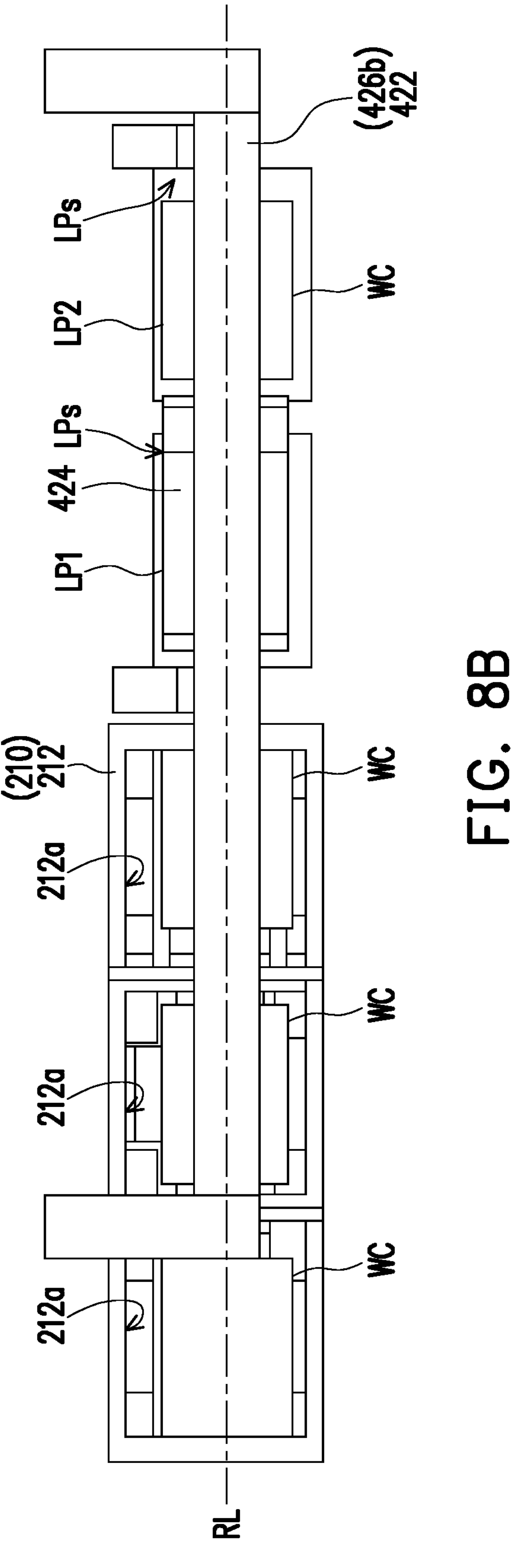
FIG. 8B is a schematic top view illustrating the configuration shown in FIG. 8A according to some embodiments of the present disclosure.

FIG. 8A is a schematic perspective view illustrating a configuration of an automated wafer carrier handling system according to some embodiments of the present disclosure and FIG. 8B is a schematic top view illustrating the configuration shown in FIG. 8A according to some embodiments of the present disclosure. It should be noted that the storage apparatus shown in FIG. 8A and FIG. 8B may be similar to the storage apparatus 210 described above, therefore the details of the storage apparatus are simplified for ease of illustration and better understanding.

Referring to FIG. 8A and FIG. 8B, an automated wafer carrier handling system 400B including the storage apparatus 210 and a transfer apparatus 420B may be similar to the automated wafer carrier handling system 400A. In some embodiments, the load ports LP1 and LP2 are disposed at the right side RS of the storage rack 212 and oriented in the same way. In other embodiments, the load ports LP1 and LP2 are relatively disposed at the left side LS and the right side RS of the storage rack 212.

For example, in the top view, the centers of the standby position and the centers of the receiving surfaces LPs of the load ports LP1 and LP2 are substantially aligned with a reference line RL. The reference line RL may be substantially aligned with the centerline of the track 422 within a required tolerance, thereby eliminating the error occurrence during the steps of picking up and placing the wafer carrier WC via the robotic arm 424. Alternatively, the centers of the standby position and the centers of the receiving surface LPs of the load ports LP1 and LP2 are not aligned, and the track 422 may be designed to meet the delivery stroke according to the configuration of the storage apparatus 210 and the load ports LP1 and LP2. The track 422 and/or the bridge member 426*b* may span over or may not span over the storage apparatus 210. It should be noted that the track 422 may be designed as linear or non-linear as long as the track 422 spanning over at least the standby position of the storage apparatus 210 and the receiving surfaces LPs of the load ports LP1 and LP2. It should be appreciated that the arrangement described herein is exemplary, and that variations thereof may be carried out while still remaining within the scope of the disclosure.

Figure 9A:
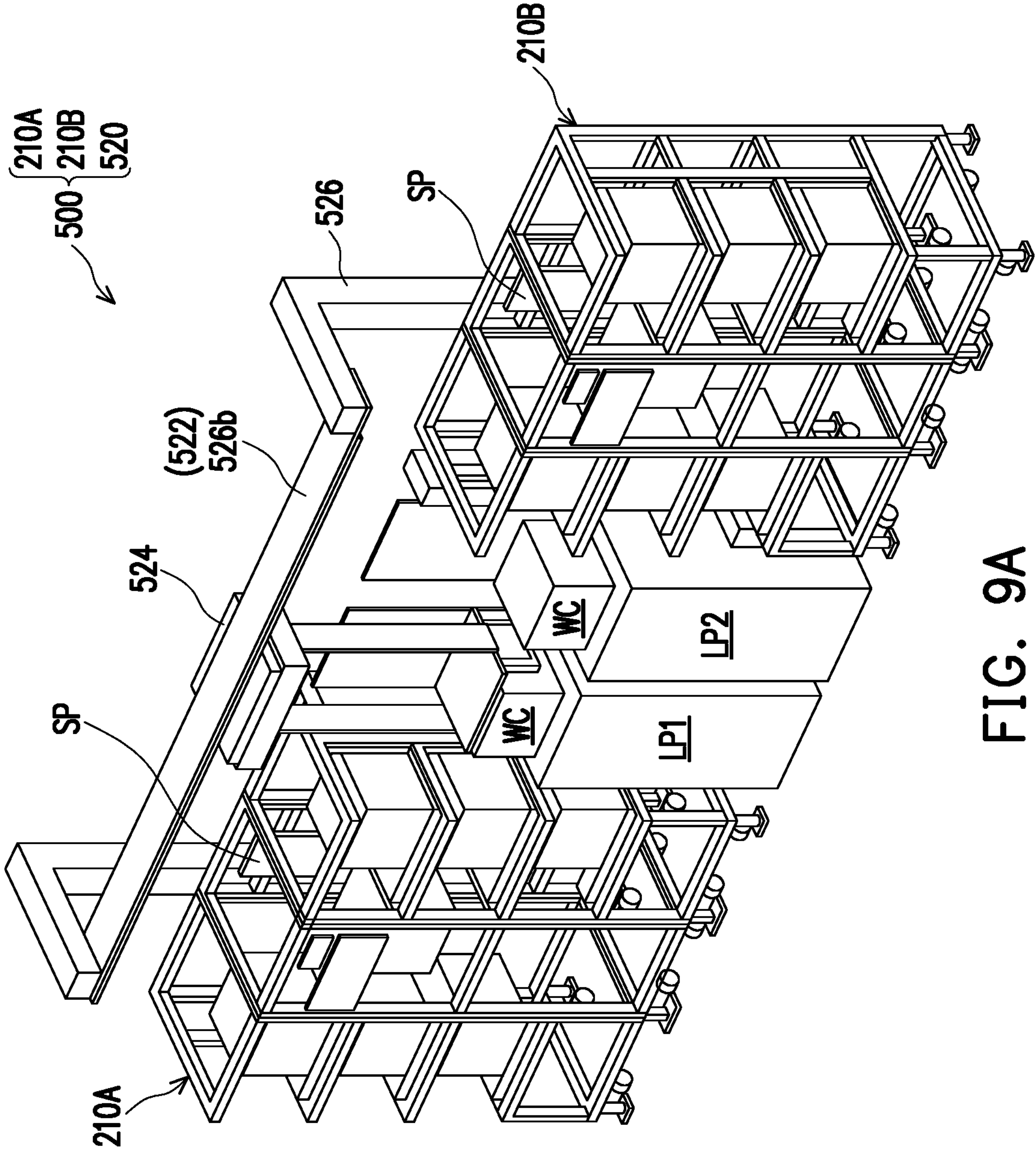
FIG. 9A is a schematic perspective view illustrating a configuration of an automated wafer carrier handling system according to some embodiments of the present disclosure.
Figure 9B:
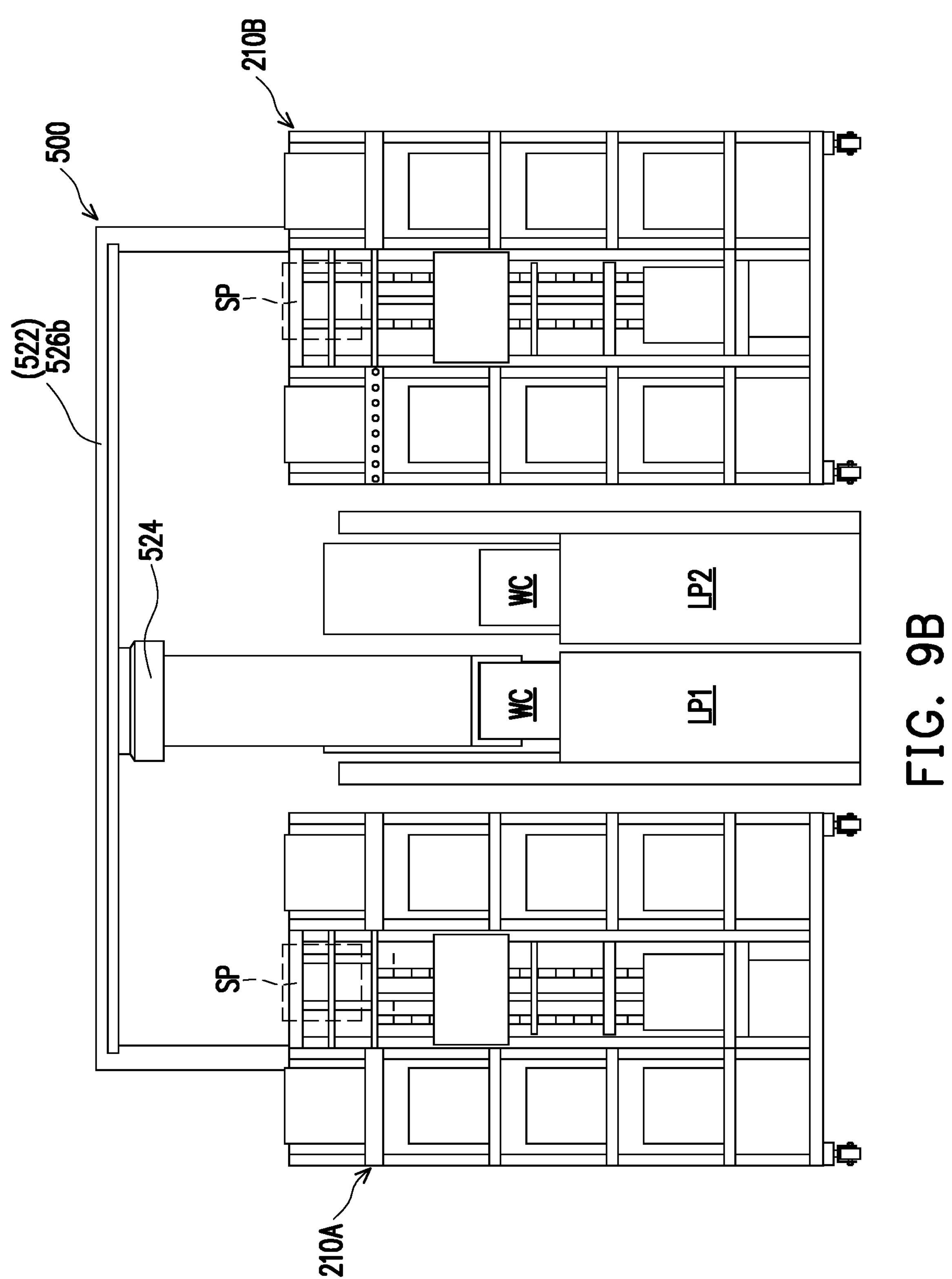
FIG. 9B is a schematic front view illustrating the configuration shown in FIG. 9A according to some embodiments of the present disclosure.

FIG. 9A is a schematic perspective view illustrating a configuration of an automated wafer carrier handling system according to some embodiments of the present disclosure and FIG. 9B is a schematic front view illustrating the configuration shown in FIG. 9A according to some embodiments of the present disclosure. It should be noted that the storage apparatus shown in FIG. 9A may be similar to the storage apparatus 210 described above, therefore the details of the storage apparatus are simplified for ease of illustration and better understanding. The storage apparatus 210A and 210B shown in FIG. 9B represent the same storage apparatus as illustrated in FIG. 9A.

Referring to FIG. 9A and FIG. 9B, an automated wafer carrier handling system 500 includes multiple storage apparatus (210A, 210B) and the transfer apparatus 520. It should be noted that two storage apparatus illustrated in FIG. 9A and FIG. 9B are merely exemplary, the number of the storage apparatus depends on the requirements and construes no limitation in the disclosure.

For example, the load ports LP1 and LP2 disposed side by side are located between the storage apparatus 210A and 210B. In some embodiments, one of the load ports LP1 and LP2 is configured to receive the wafer carrier WC including semiconductor wafers to be processed, and the other one of the load ports LP1 and LP2 may be configured to receive the wafer carrier WC including semiconductor wafers which have been processed. The wafer carrier WC including semiconductor wafers which have been processed may be transported to the next processing station manually or by a mobile robotic arm (not shown). In other embodiments, both of the load ports LP1 and LP2 are configured to receive the wafer carrier WC including semiconductor wafers to be processed. For example, the load ports LP1 is configured to receive the wafer carrier WC transferring from the storage apparatus 210A which is disposed next to the load ports LP1, and the load ports LP2 is configured to receive the wafer carrier WC transferring from the storage apparatus 210B which is disposed next to the load ports LP1. The wafer carrier WC including semiconductor wafers which have been processed may be loaded on another load port(s) disposed on other side(s) of the semiconductor processing tool or semiconductor manufacturing equipment.

The transfer apparatus 520 includes the moving mechanism (e.g., the track 522, the robotic arm 524) and the gantry 526. The transfer apparatus 520 may be similar to the transfer apparatus 420A or 420B described above. In some embodiments, the track 522 mounted on the bridge member 526*b* spans over both of the standby positions SP of the storage apparatus 210A and 210B. With such arrangement, the robotic arm 524 may be driven by the mover to transport the wafer carriers WC among the standby positions SP of the storage apparatus 210A and 210B and the load port LP1 and LP2. In some embodiments, the wafer carriers WC at the standby positions SP of the storage apparatus 210A and 210B are alternately transported to the load port (LP1 and/or LP2) via the robotic arm 524 along the track 522. The operation method (e.g., moving the wafer carriers from the compartment of the storage rack to the standby position via the moving mechanism of the storage apparatus, carrying and transferring the wafer carrier at the standby position via the moving mechanism of the transfer apparatus, and loading the wafer carrier on the load port via the moving mechanism of the transfer apparatus, etc.) may be similar to the operation method described above, so the detailed descriptions are omitted for brevity. It should be appreciated that the arrangement described herein is exemplary, and that variations thereof may be carried out while still remaining within the scope of the disclosure.

Figure 10:
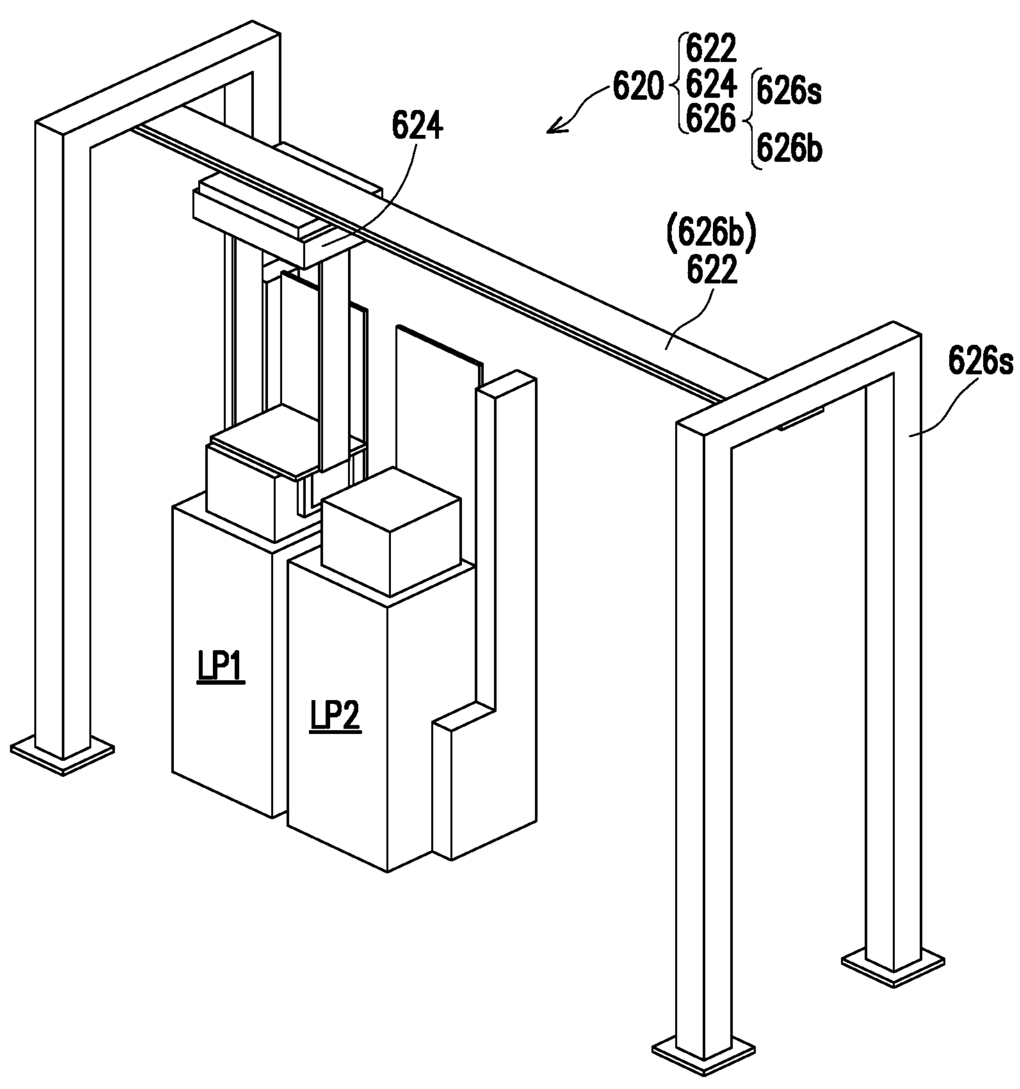
FIG. 10 is a schematic perspective view illustrating a configuration of load ports and transfer apparatus according to some embodiments of the present disclosure.

FIG. 10 is a schematic perspective view illustrating a configuration of load ports and transfer apparatus according to some embodiments of the present disclosure. Referring to FIG. 10, a transfer apparatus 620 may include the moving mechanism (e.g., the track 622 and the robotic arm 624) and the gantry 626. For example, the gantry 626 includes the side supports 626*s* and the bridge member 626*b* placed between the side supports 626*s*. The side supports 626*s* may be spaced by a certain distance depending on the number and the size of the load port(s) and the storage apparatus. In some embodiments, the side supports 626*s* are inverted U-shaped frame structures. It should be noted that the side supports 626*s* may be other type of structure as long as the side supports 626*s* may be firmly supported the bridge member 626*b*. In some embodiments, the track 622 is integratedly mounted on the bridge member 626*b*, and the robotic arm 624 is movably mounted on the track 622. The track 622 and the robotic arm 624 may be similar to the track and robotic arm described above, so the detailed descriptions are not repeated for brevity. In some embodiments, the load ports LP1 and LP2 are disposed aside one another and next to one of the side supports 626*s*. The storage apparatus (not shown) may be installed in the space between the load ports LP2 and the other one of the side supports 626*s*. It should be noted that depending on the design requirements, other configuration, e.g., the load ports are separately disposed aside the side supports 626*s*, is possible.

Figure 11:
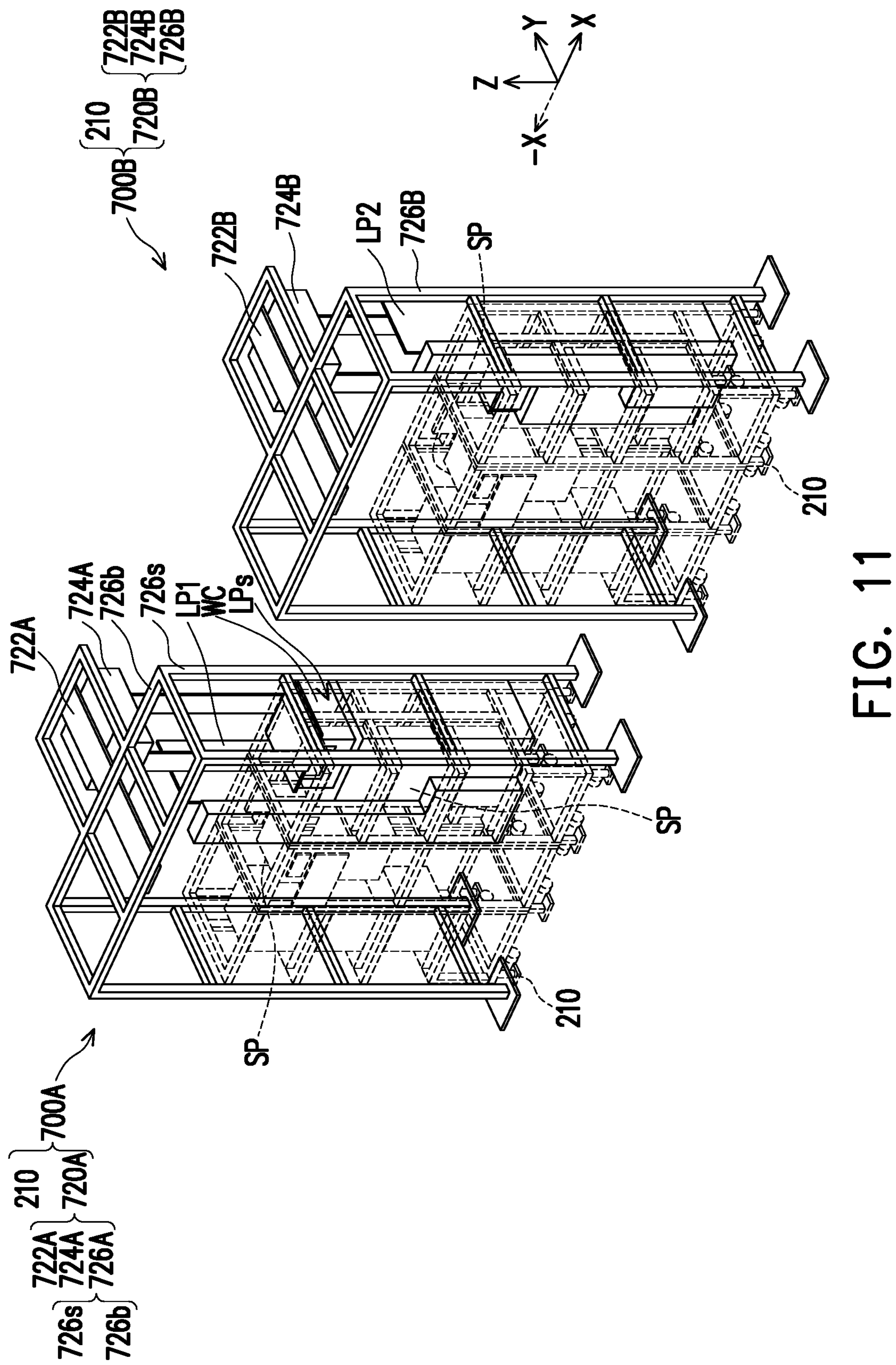
FIG. 11 is a schematic perspective view illustrating a configuration of two automated wafer carrier handling system and load ports according to some embodiments of the present disclosure.

FIG. 11 is a schematic perspective view illustrating a configuration of two automated wafer carrier handling system and load ports according to some embodiments of the present disclosure. Referring to FIG. 11, an automated wafer carrier handling system 700A corresponding to the load ports LP1 and an automated wafer carrier handling system 700B corresponding to the load ports LP2 are provided. The automated wafer carrier handling system 700A may include the storage apparatus 210 and the transfer apparatus 720A and the automated wafer carrier handling system 700B may include the storage apparatus 210 and the transfer apparatus 720B. It should be noted that the storage apparatus 210 may be similar to the storage apparatus 210 described above, therefore the details of the storage apparatus 210 are simplified and illustrated as dashed lines for a better understanding of the orientations of the LP1 and LP2 disposed behind the storage apparatus.

In some embodiments, the transfer apparatus 720A includes a moving mechanism including the track 722A and the robotic arm 724A moveably connected to the track 722A. The transfer apparatus 720A may include a gantry 726A including at least two pairs of side supports 726*s* and the bridge member 726*b*. For example, the pairs of side supports 726*s* are arranged to define corners of a rectangular area, and the bridge member 726*b* is placed perpendicular to and spans a distance between the pairs of side supports 726*s*. In some embodiments, the storage apparatus 210 is disposed within the rectangular area defined by the pairs of side supports 726*s*. The gantry 726A may include a plurality of beams/trusses spanning each of the side supports 726*s* and/or the bridge member 726*b* for strengthening the structure. It should be noted that the illustration of the gantry 726A is merely exemplary, and the structure of the gantry may take various forms.

The arrangement of the track 722A may be adapted according to the relative position of the standby position SP of the storage apparatus 210 and the receiving surface LPs of the load port LP1. In some embodiments, the track 722A is placed substantially perpendicular to the bridge member 726*b* of the gantry 726A, and the robotic arm 724A may be operably connected to the track 722A and configured to move along a linear path defined by the track 722A. Alternatively, the track 722A is disposed at an obtuse/acute angle with respect to the bridge member 726*b* of the gantry 726A. It is noted that the illustration of transfer apparatus shown in FIG. 11 is merely exemplary, and the transfer apparatus may be any suitable transfer/picking devices having any suitable transport path orientation.

The transfer apparatus 720B includes similar arrangement and components (e.g., the track 722B, the robotic arm 724B, and the gantry 726B) as the transfer apparatus 720A for transporting the wafer carriers WC to and from the load port LP2. The distance between the transfer apparatus 720A and 720B may be adjusted depends on the layout requirements and construes no limitation in the disclosure. In some embodiments, the load ports LP1 and LP2 are oriented with respect to one another, e.g., facing one another or facing away from one another. For example, the side where the receiving surface is located is considered as the front side of the load ports, and the front sides of the load ports LP1 and LP2 are disposed in the opposite axial directions (e.g., positive X-axis direction and negative X-axis direction). In some embodiments, the load ports LP1 and LP2 are respectively configured to load/unload the wafer carriers WC to and from the semiconductor fabrication equipment. Alternatively, both of the load ports LP1 and LP2 are configured to load the wafer carriers WC to semiconductor fabrication equipment for further processing.

In certain embodiments in which the load ports LP1 and LP2 are respectively configured to load/unload the wafer carriers WC, the robotic arm 724A of the transfer apparatus 720A is configured to pick up the wafer carrier WC at the standby position SP of the storage apparatus 210 under the track 722A of the transfer apparatus 720A, move to the load port LP1, and place on the receiving surface LPs of the load port LP1 for further semiconductor processing. The robotic arm 724B of the transfer apparatus 720B is configured to pick up the wafer carrier WC loaded on the receiving surface (not shown) of the load port LP2, move to the standby position SP of the storage apparatus 210 under the track 722B of the transfer apparatus 720B, and place on the carrying member of the moving mechanism positioning at the standby position SP. The wafer carrier WC transferring from the load port LP2 may include semiconductor wafers which have been processed and may be moved to an empty compartment of the storage rack through the moving mechanism. The wafer carriers WC placed on the storage apparatus 210 under the track 722B of the transfer apparatus 720B may be transported to the next processing station manually or by a mobile robotic arm (not shown). It should be appreciated that the arrangement described herein is exemplary, and that variations thereof may be carried out while still remaining within the scope of the disclosure.

Figure 12:
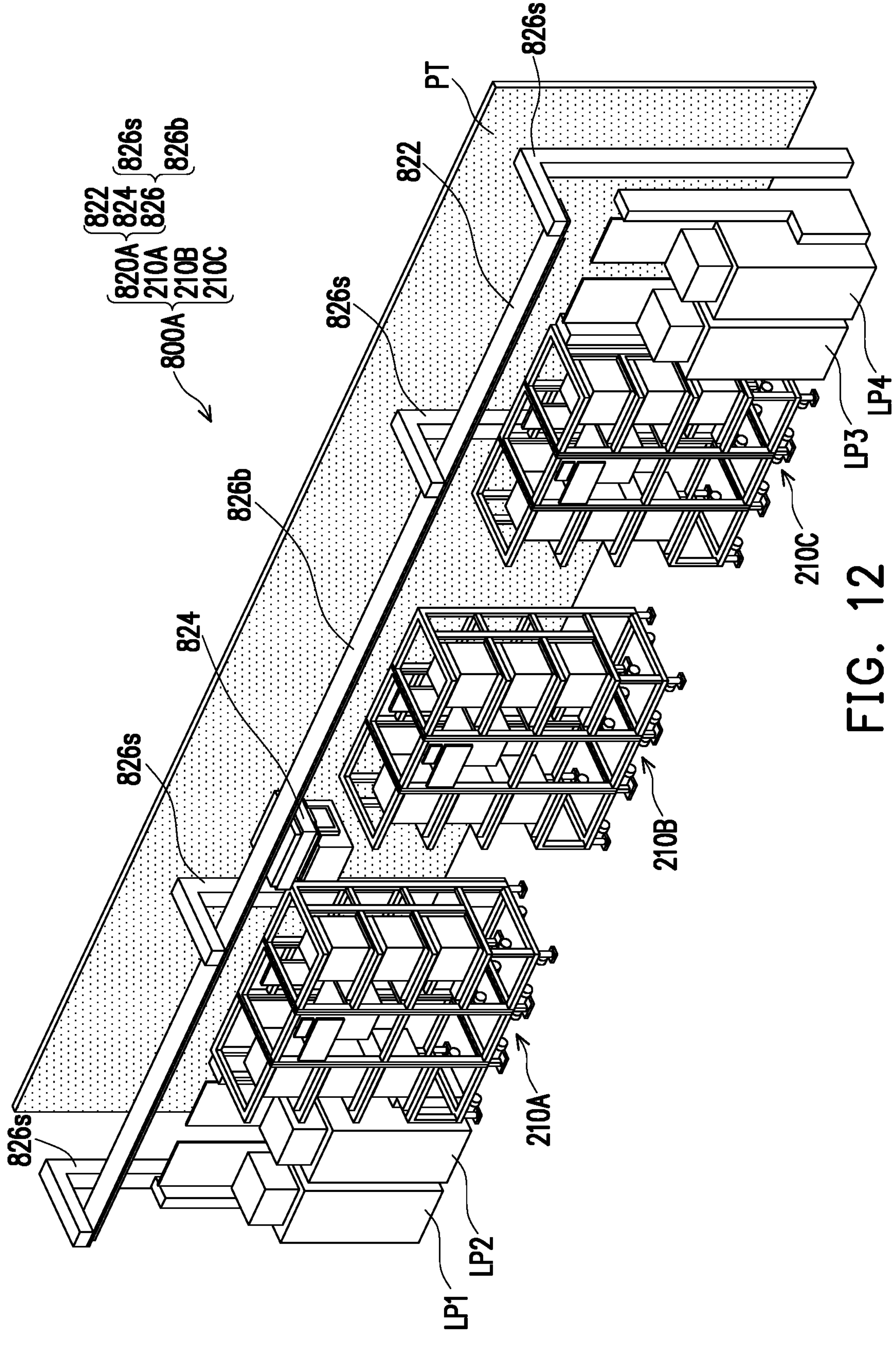
FIG. 12 is a schematic perspective view illustrating a configuration of load ports and automated wafer carrier handling system including multiple storage apparatus according to some embodiments of the present disclosure.

FIG. 12 is a schematic perspective view illustrating a configuration of load ports and automated wafer carrier handling system including multiple storage apparatus according to some embodiments of the present disclosure. Referring to FIG. 12, an automated wafer carrier handling system 800A includes a plurality of storage apparatus (210A, 210B, and 210C) and a transfer apparatus 820A. The plurality of storage apparatus (210A, 210B, and 210C) may be arranged in a row and spaced apart from one another by a clearance. In other embodiments, the storage apparatus (210A, 210B, and 210C) may be disposed immediately aside one another or integrated into a storage apparatus assembly. In some embodiments, the transfer apparatus 820A includes a track 822 disposed above the storage apparatus (210A, 210B, and 210C), the robotic arm 824 operably connected to the track 822, and the gantry 826 supporting the track 822 and the robotic arm 824.

In some embodiments, a plurality of load ports (LP1, LP2, LP3, and LP4) is respectively arranged at two opposing end of a semiconductor processing tool PT and located at the front end of the semiconductor processing tool PT. For example, the load ports LP1 and LP2 are disposed at the left side of the front end of the semiconductor processing tool PT for receiving the wafer carriers WC including semiconductor wafers to be processed, and the load ports LP3 and LP4 are disposed at the right side of the front end of the semiconductor processing tool PT for receiving the wafer carriers WC including semiconductor wafers which have been processed. It should be noted that reference to the "front", "right", and "left" sides is from the perspective of one viewing of the automated wafer carrier handling system 800A as it appears in FIG. 12. In other embodiments, one of the set of load ports (e.g., the set of LP1 and LP2, or the set of LP3 and LP4) is configured to receive the wafer carriers WC including semiconductor wafers to be processed, and the other one of the set of load ports is configured to receive the wafer carrier WC including semiconductor wafers which have been processed. Alternatively, all of the load ports (LP1, LP2, LP3, and LP4) disposed at the front end of the semiconductor processing tool PT are configured to the wafer carriers WC including semiconductor wafers to be processed, and some other load ports (not shown) may be disposed on the other side(s) of the semiconductor processing tool for receiving the wafer carriers WC including semiconductor wafers which have been processed.

For example, the row of the storage apparatus 210 is disposed between the load ports LP and located in front of the semiconductor processing tool PT. The semiconductor processing tool PT may be employed for chemical vapor deposition (CVD), physical vapor deposition (PVD), rapid thermal processing (RTP), ion implantation, diffusion, oxidation, lithography, etching, chemical mechanical polishing (CMP), testing, etc. The track 822 of the transfer apparatus 820A may span over the storage apparatus (210A, 210B, and 210C) and the load ports (LP1, LP2, LP3, and LP4), and the robotic arm 824 is configured to movably among the storage apparatus (210A, 210B, and 210C) and the load ports (LP1, LP2, LP3, and LP4) through the track 822. The gantry 826 including the bridge 826*b* and the side supports 826*s* may be similar to the gantry 426 described in FIG. 7A and FIG. 7B, except that depending on the length of the track 822, one or more additional side supports 826*s* may be utilized to provide further support. The number of the side supports 826*s* and the length of the track 826 depend on the requirement of arrangement and construe no limitation in the disclosure. It should also be noted that the configuration shown in FIG. 12 is merely exemplary, and the number of the storage apparatus, the transfer apparatus, and the load ports construe no limitation in the disclosure.

Figure 13A:
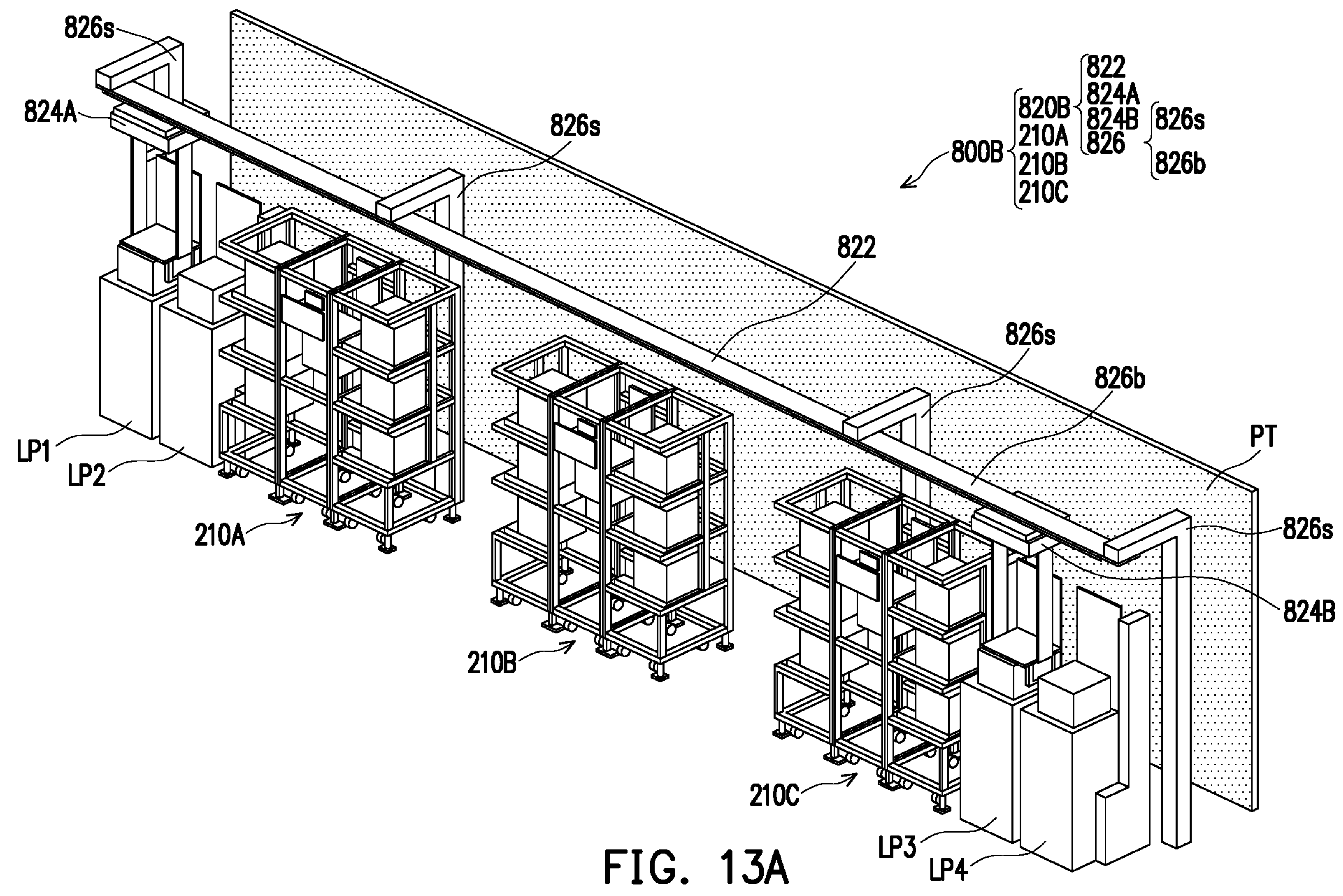
FIG. 13A is a schematic perspective view illustrating a configuration of load ports and automated wafer carrier handling system including multiple storage apparatus and robotic arms according to some embodiments of the present disclosure.
Figure 13B:
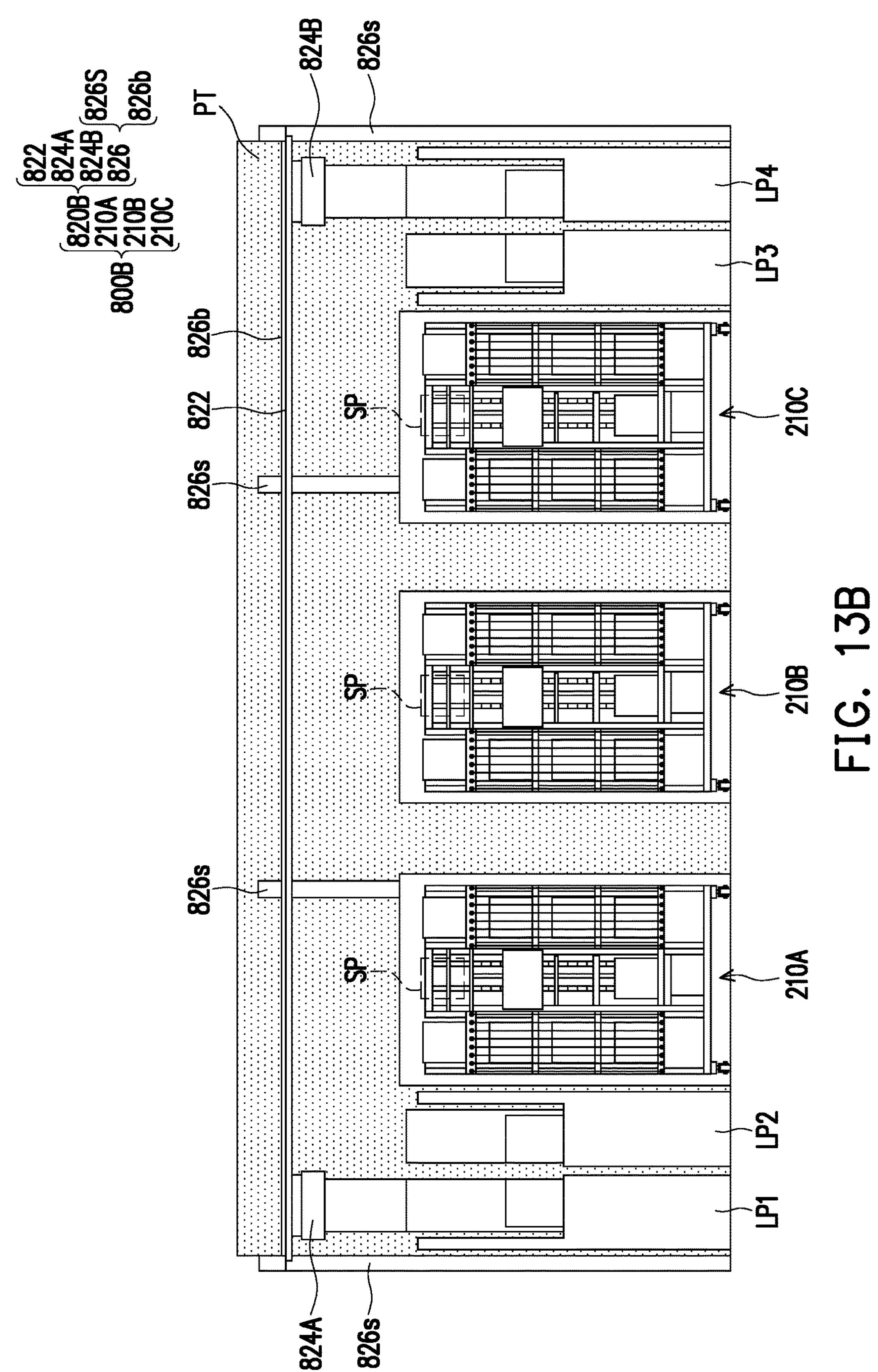
FIG. 13B is a schematic front view illustrating the configuration shown in FIG. 13A according to some embodiments of the present disclosure.

FIG. 13A is a schematic perspective view illustrating a configuration of load ports and automated wafer carrier handling system including multiple storage apparatus and robotic arms according to some embodiments of the present disclosure, and FIG. 13B is a schematic front view illustrating the configuration shown in FIG. 13A according to some embodiments of the present disclosure. Referring to FIG. 13A and FIG. 13B, an automated wafer carrier handling system 800B is similar to the automated wafer carrier handling system 800A described in FIG. 12, except that the automated wafer carrier handling system 800B includes more than one robotic arm 824A and 824B. The robotic arm 824A and 824B may be configured to move along the track 822 without interfering with one another in order to transport the wafer carriers WC between the load port (e.g., LP1, LP2, LP3, and LP4) and the standby position SP of the storage apparatus (e.g., 210A, 210B, and 210C). In other embodiments, the robotic arms 824A and 824B are configured to travel along different lanes of the track 822 to handle the wafer carriers WC among the storage apparatus (210A, 210B, and 210C) and the load ports (LP1, LP2, LP3, and LP4).

In some embodiments, all of the storage apparatus (210A, 210B, and 210C) are configured to temporarily store the wafer carriers WC including the semiconductor wafer to be processed. In other embodiments, at least one of the storage apparatus (210A, 210B, and 210C) are configured to temporarily store the wafer carriers WC including the semiconductor wafers have been processed, and one of the robotic arms 824A and 824B is configured to transport the wafer carriers WC including the semiconductor wafers have been processed to the one of the storage apparatus (210A, 210B, and 210C) such that the wafer carriers WC store in the one of the storage apparatus (210A, 210B, and 210C) may be transported to the next processing station manually or by a mobile robotic arm (not shown). It should be appreciated that the arrangement described herein is exemplary, and that variations thereof may be carried out while still remaining within the scope of the disclosure.

Figure 14:
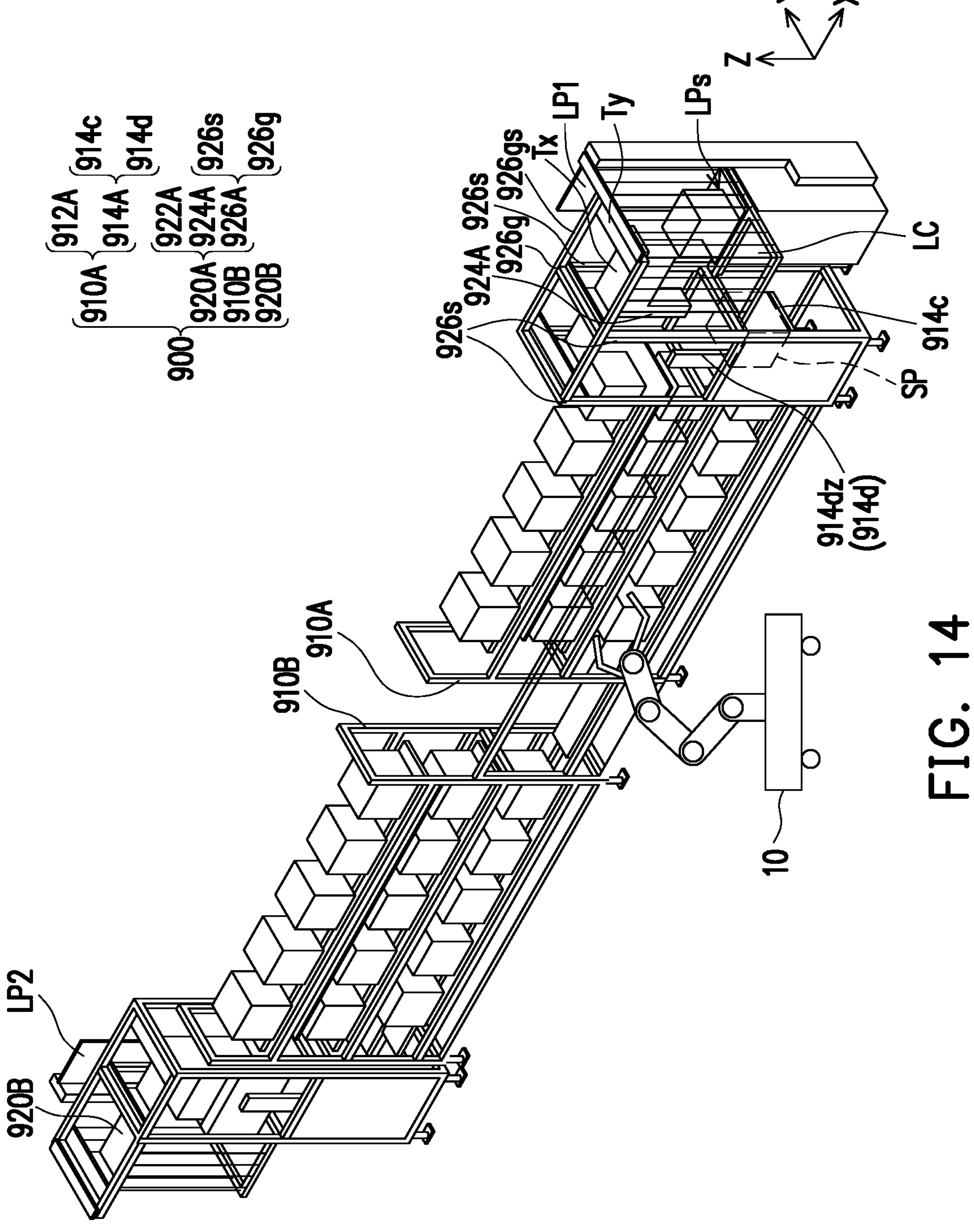
FIG. 14 is a schematic perspective view illustrating a configuration of load ports and automated wafer carrier handling system including multiple storage apparatus according to some embodiments of the present disclosure.

FIG. 14 is a schematic perspective view illustrating a configuration of load ports and automated wafer carrier handling system including multiple storage apparatus according to some embodiments of the present disclosure. Referring to FIG. 14, an automated wafer carrier handling system 900 including at least one set of storage apparatus and transfer apparatus (e.g., 910A and 920A, 910B and 920B). In some embodiments, the storage apparatus 910A includes a storage rack 912A and a moving mechanism 914A. The storage rack 912A is a shelving unit on which multiple wafer carriers WC may be temporarily stored. For example, the storage rack 912A provides a large amount of storage positions for buffering wafer carriers awaiting transfer to the load port. In some embodiments, a carrying member 914*c* disposed on a side of the storage rack 912A is configured to temporarily carry the wafer carrier WC for the transfer apparatus to transport to the load port. In some embodiments, the transfer apparatus 920A includes a track 922A, a robotic arm 924A operably connected to the track 922A, and a gantry 926A supporting the track 922A and the robotic arm 924A.

In some embodiments, a mobile loader robot 10 is configured to transport the wafer carriers WC between the storage rack (e.g., 912A and/or 912B) and the carrying member 914*c*. The mobile loader robot 10 may include a gripper or other manner of carrying the wafer carrier from place to place. For example, the mobile loader robot 10 is driven by the controller to perform the operations, such as positioning in front of the compartment (i.e. storage position) of the storage rack 912A where the wafer carrier WC is stored, moving the wafer carrier WC out from the compartment of the storage rack 912A, carrying the wafer carrier WC to the carrying member 914*c*, and place the wafer carrier WC on the carrying member 914*c*.

In some embodiments, the moving mechanism 914A includes a driving unit 914*d*. The driving unit 914*d* may include a z-axis mover 914*dz* furnished on the carrying member 914*c* and configured to drive the carrying member 914*c* to perform reciprocating movements in Z-axis direction. For example, after retrieving the wafer carrier WC from the storage rack 912A and placing the wafer carrier WC on the carrying member 914*c* via the mobile loader robot 10, the carrying member 914*c* carrying the wafer carrier WC is driven to move upwardly to the standby position via the z-axis mover 914*dz*. The driving unit 914*d* optionally includes x-axis and/or y-axis mover(s) which may be configured to perform a multi-degree-of-freedom motion. In other embodiments, the configuration of the carrying member 914*c* and the driving unit 914*d* is similar to the configuration to the carrying member and the driving unit described above, and the carrying member 914*c* may be driven by the driving unit 914*d* to move vertically and/or laterally within the storage rack 912A and to transport the wafer carrier WC to the standby position. Alternatively, the storage apparatus 910A is equipped without any moving mechanism. In such embodiments, after taking the wafer carrier WC out from the storage rack 912A and placing the wafer carrier WC on the carrying member 914*c* via the mobile loader robot 10, the robotic arm 924A of the transfer apparatus 920A is configured to move to a position above the carrying member 914*c* and lower down to grab the wafer carrier carried by the carrying member 914*c*.

In some embodiments, the gantry 926A includes at least two pairs of side supports 926*s* arranged to define corners of a rectangular area, and the bridge member 926*g* placed perpendicular to and spanning a distance between the pairs of side supports 926*s*. The carrying member 914*c* may be disposed within the rectangular area defined by the pairs of side supports 926*s*. In some embodiments, the bridge member 926*g* includes an extending structure 926*gs* which is the structure extending beyond the rectangular area defined by the pairs of side supports 926*s*. The extending structure 926*gs* may be located directly above the receiving surface LPs of the load port LP1. The track 922A may be mounted on the bridge member 926*g* so that the robotic arm 924A may be configured to move along the track 922A between the standby position SP and the receiving surface LPs of the load port LP1. For example, the track 922A includes a first section Tx and a second section Ty connected to the first section Tx, where the first section Tx may be disposed on the bridge member 926*g* in the X-axis direction and the second section Ty may be disposed on the bridge member 926*g* in the Y-axis direction. With such configuration, the robotic arm 924A may be configured to move in the X-axis direction and the Y-axis direction via the track 922A.

In some embodiments, the load ports LP1 and LP2 are equipped with the detection device LC for guarding the receiving surface LPs by detecting inadvertent entry into the load ports LP1 and LP2. The detection device LC acting as safety device may extend to guard the area defined by the extending structure 926*gs* of the bridge member 926*g*. In some embodiments in which the detection device LC includes light curtains, when an object breaks the beams of the light curtain, the detection device LC may be deactivated and a signal may be sent to the controller (not shown) so as to pause the movement of the robotic arm 924A. The operability may be improved by the use of the detection device LC.

The set of the storage apparatus 910B and the transfer apparatus 920B may include similar arrangement and components and may be carried out by the similar concept as the set of the storage apparatus 910A and the transfer apparatus 920A, so the detailed descriptions are omitted for brevity. In some embodiments, the load ports LP1 and LP2 are configured to receive the wafer carriers WC including semiconductor wafers to be processed. In other embodiments, the load port LP1 is configured to receive the wafer carrier WC including semiconductor wafers to be processed, and the load port LP2 is configured to receive the wafer carrier WC including semiconductor wafers which have been processed. In such embodiments, the storage apparatus 910B disposed aside the load port LP2 may be configured to temporarily store the wafer carrier WC including semiconductor wafers which have been processed. For example, additional mobile loader robot may be configured to transport the wafer carriers WC between the load port LP2 and the storage apparatus 910B. It should be noted that the numbers and the configuration of the mobile loader robot, the storage apparatus, the transfer apparatus, and the load ports may be adjusted depending on the requirement so as to achieve the improved operability and efficiency of semiconductor fabrication facility.

Figure 15:
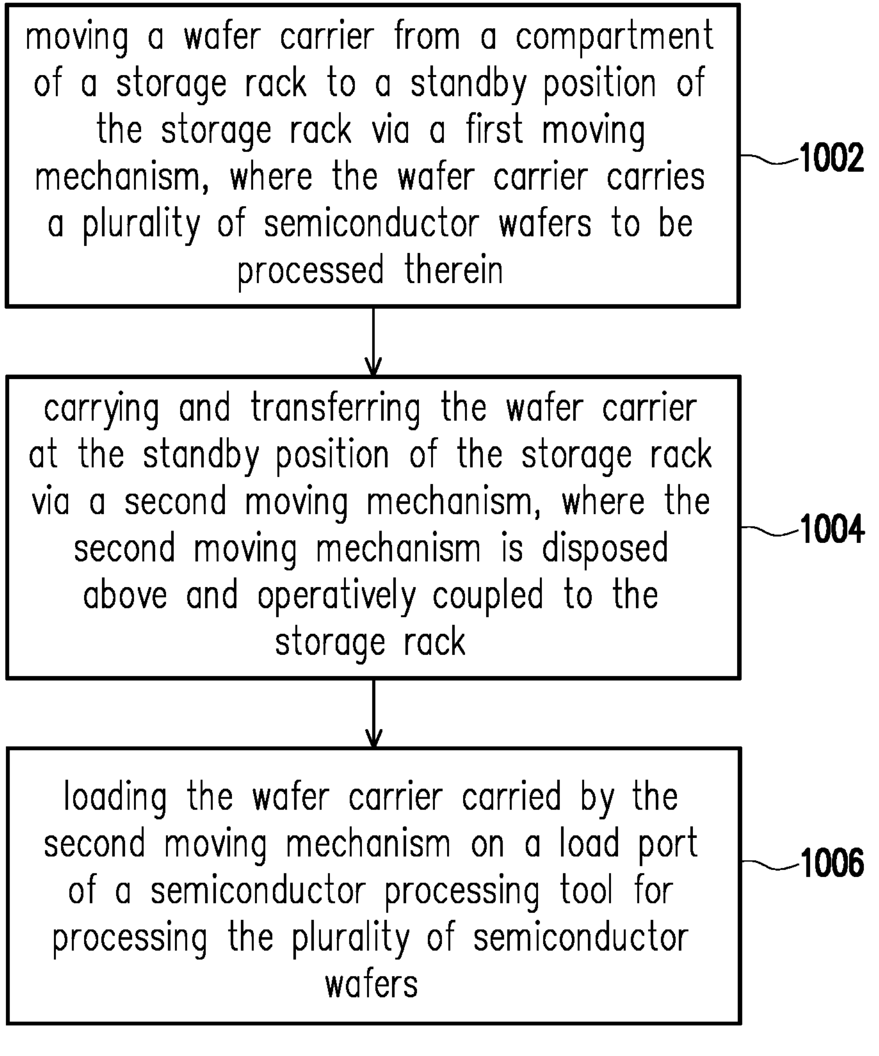
FIG. 15 is a flow diagram illustrating an operating method of a system for automated wafer carrier handling according to some embodiments of the present disclosure.

FIG. 15 is a flow diagram illustrating an operating method of a system for automated wafer carrier handling according to some embodiments of the present disclosure. While an operating method 1000 is illustrated and described below as a series of acts or operations, it should be understood that the illustrated ordering of such acts or operations are not to be interpreted in a limiting sense.

At the operation 1002, a wafer carrier is moved from a compartment of a storage rack to a standby position of the storage rack via a first moving mechanism, where the wafer carrier carries a plurality of semiconductor wafers to be processed therein. FIGS. 3A-3C illustrate the front view of the system 100 corresponding to the operation 1002, FIGS. 5A-5C illustrate the front view of the system 200 corresponding to the operation 1002, where the standby position of the storage rack is located in the middle of the storage rack, the first moving mechanism (e.g., moving mechanism 114/214) is assembled to the storage rack. The operation of moving the wafer carrier via the first moving mechanism includes reciprocating the first moving mechanism along at least one of a first axis and a second axis (e.g., the x axis, the z axis) for moving the wafer carrier out of the compartment of the storage rack and positioning at the standby position of the storage rack, where the first axis is perpendicular to the second axis. In certain embodiments in which the first moving mechanism is a mobile loader robot (e.g., the mobile loader robot 10 shown in FIG. 14) configured to move around the storage rack and the second moving mechanism, the operation of moving the wafer carrier via the first moving mechanism includes positioning the mobile loader robot in front of the compartment of the storage rack and moving the wafer carrier out from the compartment of the storage rack.

At the operation 1004, the wafer carrier at the standby position of the storage rack is carried and transferred via a second moving mechanism, where the second moving mechanism is disposed above and operatively coupled to the storage rack. FIG. 3D illustrates the side view of the system 100 corresponding to the operation 1004, FIG. 6A illustrates the side view of the system 200 corresponding to the operation 1004, where the operation of carrying and transferring the wafer carrier via the second moving mechanism includes reciprocating the second moving mechanism (e.g., transfer apparatus 120/220/320) along a third axis (e.g., the y axis) to move into and out of the storage rack for transporting the wafer carrier at the standby position out of the storage rack, and the third axis is perpendicular to the first axis and the second axis. In certain embodiments in which the standby position is set at a top of the storage rack and the load port is disposed behind the storage rack, the operation of carrying and transferring the wafer carrier via the second moving mechanism includes reciprocating the second moving mechanism (e.g., the transfer apparatus 320 shown in FIG. 6A) backward and forward relative to the storage rack between the standby position of the storage rack and the load port for transporting the wafer carrier. In certain embodiments in which the standby position is set at a top of the storage rack and the load port is disposed behind the storage rack, the operation of carrying and transferring the wafer carrier via the second moving mechanism includes reciprocating the second moving mechanism (e.g., the transfer apparatus 420A shown in FIG. 7A, the transfer apparatus 420B shown in FIG. 8A, the transfer apparatus 520 shown in FIG. 9A, etc.) laterally across the storage rack to transport the wafer carrier between the standby position of the storage rack and the load port.

At the operation 1006, the wafer carrier carried by the second moving mechanism is loaded on a load port of a semiconductor processing tool for processing the plurality of semiconductor wafers. FIG. 3D or FIG. 6B illustrates the side view of the system corresponding to the operation 1006. FIGS. 8A, 9A and other figures illustrate the perspective views of the system corresponding to the operation 1006.

According to some embodiments, a system for automated wafer carrier handling includes a storage rack, a first moving mechanism, a second moving mechanism, and a controller. The storage rack includes a standby position and a storage position separated from the standby position and the storage position is adapted to buffer a wafer carrier awaiting transfer to a load port. The first moving mechanism is movably coupled to the storage rack and provides at least one degree of freedom of movement, and the first moving mechanism is adapted to transfer the wafer carrier from the storage position to the standby position. The second moving mechanism is disposed over the storage rack, operatively coupled the storage rack to the load port, and provides at least one degree of freedom of movement. The second moving mechanism is adapted to transfer the wafer carrier from the standby position to the load port. The controller is operatively coupled to the first moving mechanism and the second moving mechanism to control operations of the first moving mechanism and the second moving mechanism.

According to some alternative embodiments, a system for automated wafer carrier handling includes a storage apparatus, a transfer apparatus, and a controller. The storage apparatus includes a storage rack having a compartment for accommodating a wafer carrier, and a first moving mechanism coupled to the storage rack for laterally and vertically moving the wafer carrier from the compartment of the storage rack to a standby position of the storage apparatus. The transfer apparatus is disposed above the storage apparatus and includes a second moving mechanism adapted to transfer the wafer carrier from the standby position of the storage apparatus to a load port for semiconductor processing. The controller interfaces with the first moving mechanism of the storage apparatus and the second moving mechanism of the transfer apparatus to control a movement of the wafer carrier driven by the first moving mechanism of the storage apparatus and the second moving mechanism of the transfer apparatus.

According to some alternative embodiments, an operating method for automated wafer carrier handling includes at least the following steps. A wafer carrier is moved from a compartment of a storage rack to a standby position of the storage rack via a first moving mechanism, where the wafer carrier carries a plurality of semiconductor wafers to be processed therein. The wafer carrier at the standby position of the storage rack is carried and transferred via a second moving mechanism, where the second moving mechanism is disposed above and operatively coupled to the storage rack. The wafer carrier carried by the second moving mechanism is loaded on a load port of a semiconductor processing tool for processing the plurality of semiconductor wafers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for automated wafer carrier handling, comprising:

a storage rack, comprising a first column and a second column extending in a first direction of the storage rack, the first and second columns comprising compartments for wafer carrier storage, wherein a standby position is located in a space interposed between the first and second columns, and is adapted to buffer a wafer carrier awaiting transfer to a load port of a semiconductor processing tool external to the storage rack, the standby position comprises a first side covered by a panel of the storage rack, a second side opposite to the first side and adjacent to the load port, a third side connected to the first and second sides and adjacent to the first column, and a fourth side opposite to the third side and adjacent to the second column;

a first moving mechanism, disposed in the storage rack, and is adapted to transfer a wafer carrier from the compartments in the first column or the second column to the space interposed between the first and second columns and provide support for the wafer carrier transferred to the standby position; and a second moving mechanism, comprising a track extending from the space interposed between the first and second columns of the storage rack to the load port of the semiconductor processing tool along a third direction and a robotic arm movable along the track, wherein the robotic arm is adapted to transfer a wafer carrier from the standby position in the storage rack to the load port external to the storage rack, and the first, second, and third directions are different.

2. The system for automated wafer carrier handling according to claim 1, further comprising:

a controller, operatively coupled to the first and second moving mechanisms, to control operations of the first and second moving mechanisms.

3. The system for automated wafer carrier handling according to claim 1, wherein the first moving mechanism comprises:

a carrying member, adapted to reach into the compartments and provide support for a wafer carrier being transferred by the first moving mechanism; and a driving unit, configured to drive the carrying member along at least one lateral direction and a vertical direction.

4. The system for automated wafer carrier handling according to claim 1, wherein the second moving mechanism is configured to elevate a wafer carrier from the standby position, and to move the wafer carrier to above the load port along a lateral path over the storage rack.

5. The system for automated wafer carrier handling according to claim 1, wherein the space interposed between the first and second columns of the storage rack comprises a top position, the standby position, and a bottom position arranged in sequence along the first direction.

6. The system for automated wafer carrier handling according to claim 1, wherein the third side of the standby position is unmasked by the storage rack.

7. The system for automated wafer carrier handling according to claim 1, wherein a receiving surface of the load port is defined at a top end of the load port, and is leveled with a bottom end of the standby position.

8. The system for automated wafer carrier handling according to claim 1, wherein a receiving surface of the load port at a top end of the load port is lower than a bottom end of the standby position.

9. The system for automated wafer carrier handling according to claim 1, wherein the semiconductor processing tool further comprises an additional load port, external to the storage rack and arranged side-by-side with the load port.

10. The system for automated wafer carrier handling according to claim 9, wherein the load port is configured to load an unprocessed wafer to the semiconductor processing tool, and the additional load port is configured to unload the processed wafer from the semiconductor processing tool.

11. The system for automated wafer carrier handling according to claim 1, wherein the first and second column of the compartments of the storage rack is unmasked by the panel.

12. The system for automated wafer carrier handling according to claim 1, wherein the standby position further comprises a top side which is covered by a top of the storage rack, and the track of the second moving mechanism is assembled onto the top of the storage rack.

13. A system for automated wafer carrier handling, comprising:

storage racks, spaced apart from one another in a first direction, and each defining multiple compartments for wafer carrier storage, each of the storage racks comprising a first column and a second column arranged in sequence along the first direction, and each of the first and second columns extending along a height direction of the storage racks, wherein a standby position is located inside a space interposed between the first and second columns, and is adapted to buffer a wafer carrier awaiting transfer to a semiconductor processing tool external to the storage racks;

first moving mechanisms, respectively disposed in one of the storage racks, and each adapted to transfer a wafer carrier from one of the compartments in one of the storage racks to the standby position in the one of the storage racks; and a second moving mechanism, comprising a first track extending between the space interposed between the first and second columns of a first storage rack of the storage racks and a first load port of the semiconductor processing tool along a second direction different from the first direction, wherein the first track is assembled onto a top of the first storage rack and between the standby position and the top of the first storage rack in the height direction.

14. The system for automated wafer carrier handling according to claim 13, wherein the second moving mechanism further comprises a second track spaced apart from the first track in the first direction and extending between the space interposed between the first and second columns of a second storage rack of the storage racks and a second load port of the semiconductor processing tool along the second direction, wherein the first load port is spaced apart from the second load port in the first direction.

15. The system for automated wafer carrier handling according to claim 13, wherein the first storage rack comprises a front side, a panel disposed at the front side and covering the space interposed between the first and second columns, and a back side adjacent to the first load port of the semiconductor processing tool, wherein the first column and the second column of the first storage rack are unmasked by the panel.

16. The system for automated wafer carrier handling according to claim 13, wherein the semiconductor processing tool further comprises an additional load port external to the storage racks and arranged side-by-side with the first load port, and the second moving mechanism is further adapted to transfer a wafer carrier from the standby position in any one of the storage racks to the additional load port of the semiconductor processing tool.

17. The system for automated wafer carrier handling according to claim 13, wherein the second moving mechanism further comprises a robotic arm movable along the first track.

18. The system for automated wafer carrier handling according to claim 13, wherein one of the first moving mechanisms comprises a carrying surface, the wafer carrier is disposed on the carrying surface at the standby position, and the carrying surface at the standby position is higher than a bottom of a topmost compartment in the first column relative to a bottom of the first storage rack.

19. An operation method for automated wafer carrier handling, comprising:

using a controller to operate a first moving mechanism for moving a wafer carrier holding unprocessed wafers in a storage rack to a standby position, wherein:
  - the storage rack comprises a first column and a second column arranged along a lateral direction, and a space interposed between the first and second columns along the lateral direction,
  - the first and second columns comprise compartments,
  - the space comprises a first position, the standby position, and a second position arranged in sequence along a height direction, and
  - the first moving mechanism is disposed inside the storage rack; and using the controller to operate a second moving mechanism for transferring the wafer carrier holding the unprocessed wafers to a load port of a semiconductor processing tool from the standby position, wherein the load port is external to the storage rack.

20. The operation method for automated wafer carrier handling according to claim 19, further comprising:

using the controller to operate the second moving mechanism for moving a wafer carrier holding processed wafers to the standby position from the load port; and using the controller to operate the first moving mechanism for transferring the wafer carrier holding the processed wafer to one of the compartments from the standby position.

* * * * *